US009927654B2

(12) United States Patent
Jintyou et al.

(10) Patent No.: US 9,927,654 B2
(45) Date of Patent: Mar. 27, 2018

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Masami Jintyou, Tochigi (JP); Yamato Aihara, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 57 days.

(21) Appl. No.: 14/678,037

(22) Filed: Apr. 3, 2015

(65) Prior Publication Data
US 2015/0316818 A1 Nov. 5, 2015

Related U.S. Application Data

(63) Continuation of application No. 13/030,199, filed on Feb. 18, 2011, now Pat. No. 9,000,438.

(30) Foreign Application Priority Data

Feb. 26, 2010 (JP) .................................. 2010-043185

(51) Int. Cl.
*H01L 29/786* (2006.01)
*G02F 1/1343* (2006.01)
(Continued)

(52) U.S. Cl.
CPC ...... *G02F 1/133553* (2013.01); *G02F 1/1336* (2013.01); *G02F 1/1368* (2013.01);
(Continued)

(58) Field of Classification Search
CPC ......... G02F 1/133553; G02F 1/133555; H01L 27/326; H01L 27/3262; H01L 27/3272;
(Continued)

(56) References Cited

U.S. PATENT DOCUMENTS 5,475,398 A 12/1995 Yamazaki et al.
5,731,856 A 3/1998 Kim et al.
(Continued)

FOREIGN PATENT DOCUMENTS

EP 1113308 A 7/2001
EP 1209748 A 5/2002
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Matthew Landau
*Assistant Examiner* — Scott Stowe
(74) *Attorney, Agent, or Firm* — Fish & Richardson P.C.

(57) ABSTRACT

It is an object to provide a display device of which image display can be favorably recognized. Another object is to provide a manufacturing method of the display device with high productivity. Over a substrate, a pixel electrode that reflects incident light through a liquid crystal layer, a light-transmitting pixel electrode, and a structure whose side surface is covered with a reflective layer and which is positioned to overlap with the light-transmitting pixel electrode are provided. The structure is formed over a light-transmitting etching-stop layer, and the etching-stop layer remains below the structure as a light-transmitting layer.

23 Claims, 20 Drawing Sheets

(51) Int. Cl.
   *G02F 1/1335* (2006.01)
   *G02F 1/1333* (2006.01)
   *G02F 1/1368* (2006.01)
   *H01L 27/12* (2006.01)

(52) U.S. Cl.
   CPC .... *G02F 1/13439* (2013.01); *G02F 1/133345* (2013.01); *G02F 1/133524* (2013.01); *G02F 1/133555* (2013.01); *H01L 27/1225* (2013.01)

(58) Field of Classification Search
   CPC ........... H01L 27/3248; H01L 29/78633; H01L 29/7869; H01L 29/78693
   See application file for complete search history.

(56) References Cited

U.S. PATENT DOCUMENTS

| | | |
|---|---|---|
| 5,744,864 A | 4/1998 | Cillessen et al. |
| 5,808,712 A | 9/1998 | Hishida et al. |
| 6,195,140 B1 | 2/2001 | Kubo et al. |
| 6,294,274 B1 | 9/2001 | Kawazoe et al. |
| 6,295,109 B1 | 9/2001 | Kubo et al. |
| 6,330,047 B1 | 12/2001 | Kubo et al. |
| 6,384,886 B2 | 5/2002 | Yamazaki et al. |
| 6,452,654 B2 | 9/2002 | Kubo et al. |
| 6,535,985 B1 | 3/2003 | Oshima et al. |
| 6,552,711 B1 | 4/2003 | Nakamura |
| 6,563,174 B2 | 5/2003 | Kawasaki et al. |
| 6,597,348 B1 | 7/2003 | Yamazaki et al. |
| 6,650,481 B2 | 11/2003 | Osawa et al. |
| 6,683,666 B1 | 1/2004 | Jang et al. |
| 6,727,522 B1 | 4/2004 | Kawasaki et al. |
| 6,727,965 B1 | 4/2004 | Kubota |
| 6,765,637 B2 | 7/2004 | Takenaka |
| 6,782,483 B2 | 8/2004 | Oshima et al. |
| 6,792,552 B2 | 9/2004 | Oshima et al. |
| 6,795,929 B2 | 9/2004 | Oshima et al. |
| 6,804,791 B2 | 10/2004 | Oshima et al. |
| 6,808,868 B2 | 10/2004 | Fujibayashi et al. |
| 6,819,378 B2 | 11/2004 | Yamazaki et al. |
| 6,819,379 B2 | 11/2004 | Kubo et al. |
| 6,839,855 B2 | 1/2005 | Oshima et al. |
| 6,858,983 B2 | 2/2005 | Mochizuki et al. |
| 6,882,389 B2 | 4/2005 | Oshima et al. |
| 6,909,483 B2 | 6/2005 | Oshima et al. |
| 6,950,159 B2 | 9/2005 | Kubo et al. |
| 6,952,248 B2 | 10/2005 | Oshima et al. |
| 6,952,787 B2 | 10/2005 | Oshima et al. |
| 6,971,037 B2 | 11/2005 | Oshima et al. |
| 6,990,595 B2 | 1/2006 | Oshima et al. |
| 7,006,181 B2 | 2/2006 | Oshima et al. |
| 7,024,572 B2 | 4/2006 | Oshima et al. |
| 7,049,190 B2 | 5/2006 | Takeda et al. |
| 7,053,969 B2 | 5/2006 | Yamazaki et al. |
| 7,061,014 B2 | 6/2006 | Hosono et al. |
| 7,061,555 B2 | 6/2006 | Wu et al. |
| 7,062,667 B2 | 6/2006 | Oshima et al. |
| 7,064,346 B2 | 6/2006 | Kawasaki et al. |
| 7,073,084 B2 | 7/2006 | Oshima et al. |
| 7,079,108 B2 | 7/2006 | Oshima et al. |
| 7,080,272 B2 | 7/2006 | Oshima et al. |
| 7,105,868 B2 | 9/2006 | Nause et al. |
| 7,120,809 B2 | 10/2006 | Oshima et al. |
| 7,129,918 B2 | 10/2006 | Kimura |
| 7,145,536 B1 | 12/2006 | Yamazaki et al. |
| 7,151,581 B2 | 12/2006 | Kubo et al. |
| 7,211,825 B2 | 5/2007 | Shih et al. |
| 7,212,265 B2 | 5/2007 | Eguchis et al. |
| 7,212,267 B2 | 5/2007 | Fujimori et al. |
| 7,213,162 B2 | 5/2007 | Oshimam et al. |
| 7,242,449 B1 | 7/2007 | Yamazaki et al. |
| 7,282,782 B2 | 10/2007 | Hoffman et al. |
| 7,297,977 B2 | 11/2007 | Hoffman et al. |
| 7,317,438 B2 | 1/2008 | Yamazaki et al. |
| 7,323,356 B2 | 1/2008 | Hosono et al. |
| 7,385,224 B2 | 6/2008 | Ishii et al. |
| 7,385,579 B2 | 6/2008 | Satake |
| 7,402,506 B2 | 7/2008 | Levy et al. |
| 7,411,209 B2 | 8/2008 | Endo et al. |
| 7,432,921 B2 | 10/2008 | Oshima et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,464,281 B2 | 12/2008 | Oshima et al. |
| 7,468,304 B2 | 12/2008 | Kaji et al. |
| 7,468,768 B2 | 12/2008 | Kubo et al. |
| 7,495,725 B2 | 2/2009 | Kim et al. |
| 7,501,293 B2 | 3/2009 | Ito et al. |
| 7,525,614 B2 | 4/2009 | Jeong et al. |
| 7,535,528 B2 | 5/2009 | Kubo et al. |
| 7,548,235 B2 | 6/2009 | Oshima et al. |
| 7,570,072 B2 | 8/2009 | Hata et al. |
| 7,583,337 B2 | 9/2009 | Ahn et al. |
| 7,612,849 B2 | 11/2009 | Eguchi et al. |
| 7,626,660 B2 | 12/2009 | Takizawa et al. |
| 7,646,452 B2 | 1/2010 | Nakanishi et al. |
| 7,663,717 B2 | 2/2010 | Kubo et al. |
| 7,674,650 B2 | 3/2010 | Akimoto et al. |
| 7,732,819 B2 | 6/2010 | Akimoto et al. |
| 7,738,055 B2 | 6/2010 | Egi et al. |
| 7,791,571 B2 | 9/2010 | Ohtani et al. |
| 7,817,229 B2 | 10/2010 | Sakamoto et al. |
| 7,821,489 B2 | 10/2010 | Oshima et al. |
| 7,821,613 B2 | 10/2010 | Kimura |
| 7,889,154 B2 | 2/2011 | Araki et al. |
| 7,948,461 B2 | 5/2011 | Kageyama et al. |
| 7,952,667 B2 | 5/2011 | Kubo et al. |
| 7,956,363 B2 | 6/2011 | Hoshino et al. |
| 8,023,074 B2 | 9/2011 | Watanabe |
| 8,054,423 B2 | 11/2011 | Kubo et al. |
| 8,077,276 B2 | 12/2011 | Uchida |
| 8,223,115 B2 | 7/2012 | Chung et al. |
| 8,228,469 B2 | 7/2012 | Kubo et al. |
| 8,295,892 B2 | 10/2012 | Kim et al. |
| 8,330,916 B2 | 12/2012 | Lee et al. |
| 2001/0020991 A1* | 9/2001 | Kubo ................ G02F 1/133555 349/113 |
| 2001/0022584 A1 | 9/2001 | Tsugawa |
| 2001/0046027 A1 | 11/2001 | Tai et al. |
| 2002/0027627 A1* | 3/2002 | Yamada ............ G02F 1/133555 349/113 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0169625 A1 | 9/2004 | Park et al. |
| 2005/0017302 A1 | 1/2005 | Hoffman |
| 2005/0094067 A1 | 5/2005 | Sakamoto et al. |
| 2005/0128176 A1 | 6/2005 | Oshima et al. |
| 2005/0128177 A1 | 6/2005 | Oshima et al. |
| 2005/0168400 A1 | 8/2005 | Oshima et al. |
| 2005/0199959 A1 | 9/2005 | Chiang et al. |
| 2005/0270452 A1 | 12/2005 | Ahn et al. |
| 2006/0007102 A1 | 1/2006 | Yasuoka et al. |
| 2006/0035452 A1 | 2/2006 | Carcia et al. |
| 2006/0043377 A1 | 3/2006 | Hoffman et al. |
| 2006/0044240 A1 | 3/2006 | Takizawa et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125755 A1 | 6/2006 | Noguchi et al. |
| 2006/0139528 A1 | 6/2006 | Fujimori et al. |
| 2006/0158587 A1 | 7/2006 | Chang et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0203154 A1 | 9/2006 | Uchida |

(56) References Cited

U.S. PATENT DOCUMENTS

| | | |
|---|---|---|
| 2006/0208977 A1 | 9/2006 | Kimura |
| 2006/0209002 A1 | 9/2006 | Uchikawa |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0061560 A1 | 3/2007 | Oshima et al. |
| 2007/0061604 A1 | 3/2007 | Oshima et al. |
| 2007/0080349 A1* | 4/2007 | Hoshino ............ G02F 1/136227 257/59 |
| 2007/0090365 A1 | 4/2007 | Hayashi et al. |
| 2007/0108446 A1 | 5/2007 | Akimoto |
| 2007/0136566 A1 | 6/2007 | Oshima et al. |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0176875 A1 | 8/2007 | Kageyama et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279374 A1 | 12/2007 | Kimura et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042926 A1 | 2/2008 | Egi et al. |
| 2008/0050595 A1 | 2/2008 | Nakagawara et al. |
| 2008/0073653 A1 | 3/2008 | Iwasaki |
| 2008/0074592 A1 | 3/2008 | Araki et al. |
| 2008/0083950 A1 | 4/2008 | Pan et al. |
| 2008/0094554 A1* | 4/2008 | Sato ................ G02F 1/136213 349/114 |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284720 A1 | 11/2008 | Fukutome |
| 2008/0284929 A1 | 11/2008 | Kimura |
| 2008/0296568 A1 | 12/2008 | Ryu et al. |
| 2008/0297676 A1 | 12/2008 | Kimura |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0002586 A1 | 1/2009 | Kimura |
| 2009/0002597 A1 | 1/2009 | Watanabe |
| 2009/0008639 A1 | 1/2009 | Akimoto et al. |
| 2009/0009455 A1 | 1/2009 | Kimura |
| 2009/0011611 A1 | 1/2009 | Ichijo et al. |
| 2009/0059107 A1 | 3/2009 | Nagai et al. |
| 2009/0066880 A1 | 3/2009 | Sugita et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0174835 A1 | 7/2009 | Lee et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0298554 A1 | 12/2009 | Kim et al. |
| 2009/0303170 A1 | 12/2009 | Chung et al. |
| 2009/0305461 A1 | 12/2009 | Akimoto et al. |
| 2009/0315880 A1 | 12/2009 | Cho et al. |
| 2010/0065844 A1 | 3/2010 | Tokunaga |
| 2010/0084651 A1 | 4/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0155719 A1 | 6/2010 | Sakata et al. |
| 2010/0163863 A1 | 7/2010 | Yaegashi |
| 2011/0115839 A1 | 5/2011 | Takahashi et al. |
| 2011/0157216 A1 | 6/2011 | Yamazaki et al. |
| 2011/0157252 A1 | 6/2011 | Yamazaki et al. |
| 2011/0157253 A1 | 6/2011 | Yamazaki et al. |
| 2011/0157254 A1 | 6/2011 | Yamazaki et al. |
| 2011/0193852 A1 | 8/2011 | Lee et al. |
| 2011/0205468 A1 | 8/2011 | Hirakata et al. |
| 2012/0038604 A1 | 2/2012 | Liu et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-253566 A | 10/1995 |
| JP | 08-264794 A | 10/1996 |
| JP | 09-230827 A | 9/1997 |
| JP | 09-251162 A | 9/1997 |
| JP | 11-101992 A | 4/1999 |
| JP | 11-505377 | 5/1999 |
| JP | 2000-044236 A | 2/2000 |
| JP | 2000-150900 A | 5/2000 |
| JP | 2000-305110 A | 11/2000 |
| JP | 2001-075091 A | 3/2001 |
| JP | 2002-076356 A | 3/2002 |
| JP | 2002-229021 A | 8/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2003-177396 A | 6/2003 |
| JP | 2003-186031 A | 7/2003 |
| JP | 2003-195329 A | 7/2003 |
| JP | 2003-227903 A | 8/2003 |
| JP | 2003-241184 A | 8/2003 |
| JP | 2003-262863 A | 9/2003 |
| JP | 2003-279967 A | 10/2003 |
| JP | 2004-103957 A | 4/2004 |
| JP | 2004-126199 A | 4/2004 |
| JP | 2004-205663 A | 7/2004 |
| JP | 2004-226612 A | 8/2004 |
| JP | 2004-273614 A | 9/2004 |
| JP | 2004-273732 A | 9/2004 |
| JP | 2005-017493 A | 1/2005 |
| JP | 2005-024680 A | 1/2005 |
| JP | 2005-062573 A | 3/2005 |
| JP | 2005-190295 A | 7/2005 |
| JP | 2006-119416 A | 5/2006 |
| JP | 2006-184609 A | 7/2006 |
| JP | 2007-071939 A | 3/2007 |
| JP | 2007-096055 A | 4/2007 |
| JP | 2007-123861 A | 5/2007 |
| JP | 2007-183323 A | 7/2007 |
| JP | 2007-293153 A | 11/2007 |
| JP | 2008-083387 A | 4/2008 |
| JP | 2008-261944 A | 10/2008 |
| JP | 2009-047965 A | 3/2009 |
| JP | 2009-200355 A | 9/2009 |

(56) References Cited

FOREIGN PATENT DOCUMENTS

| JP | 2009-229967 A | 10/2009 |
|---|---|---|
| WO | WO-2004/114391 | 12/2004 |
| WO | WO-2005/080529 | 9/2005 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystallin InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest D9 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2008, vol. 90, No. 26, pp. 262106-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

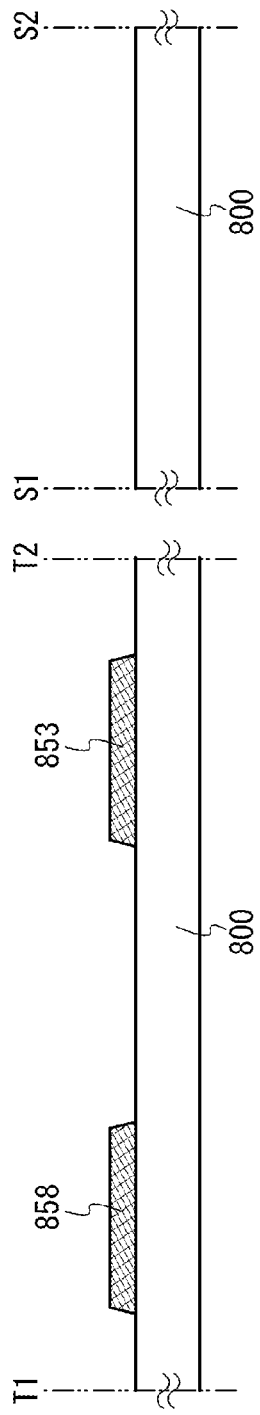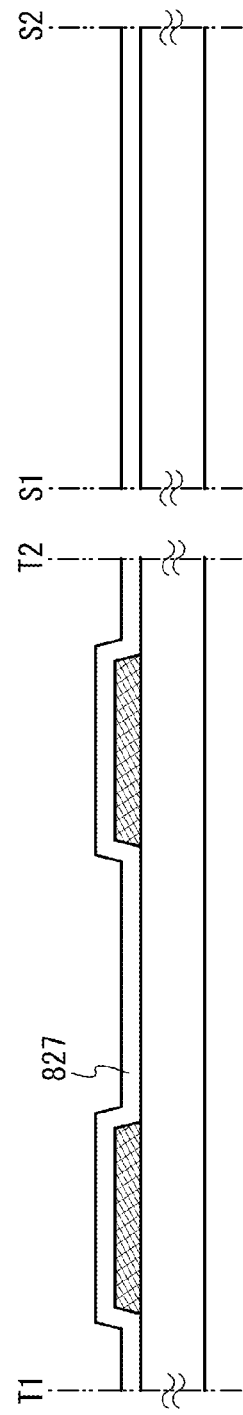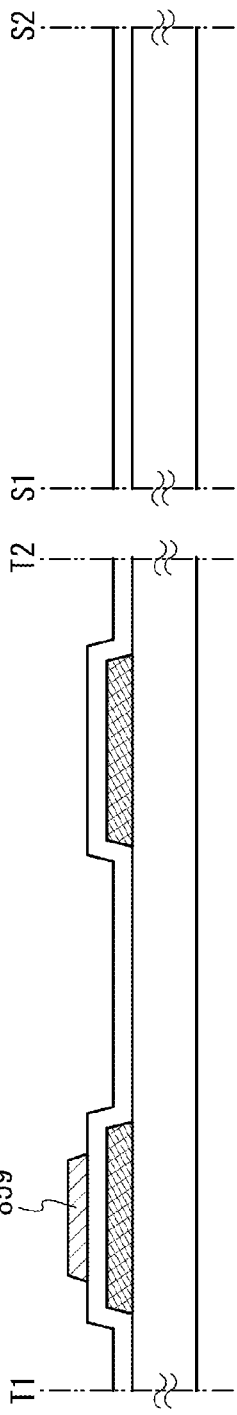

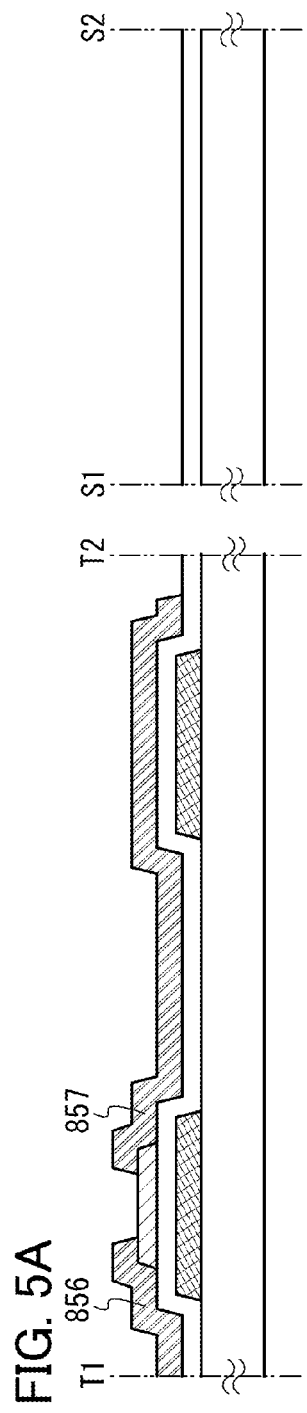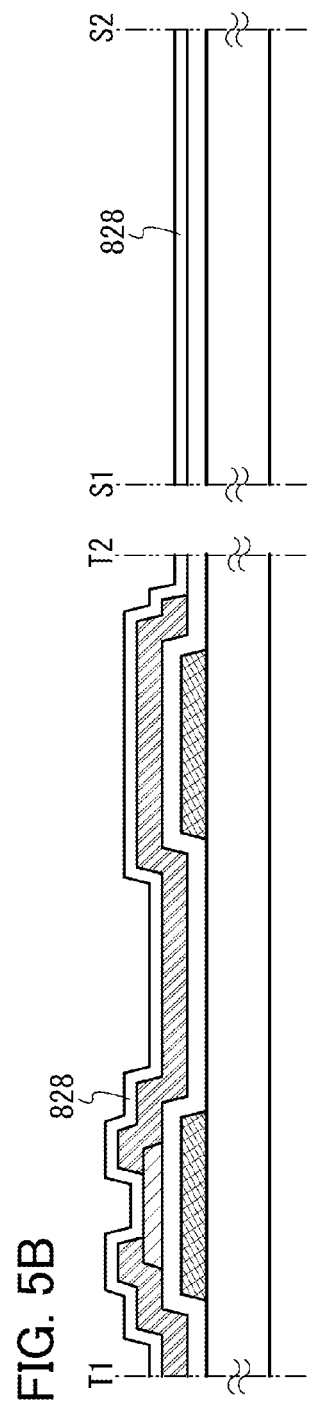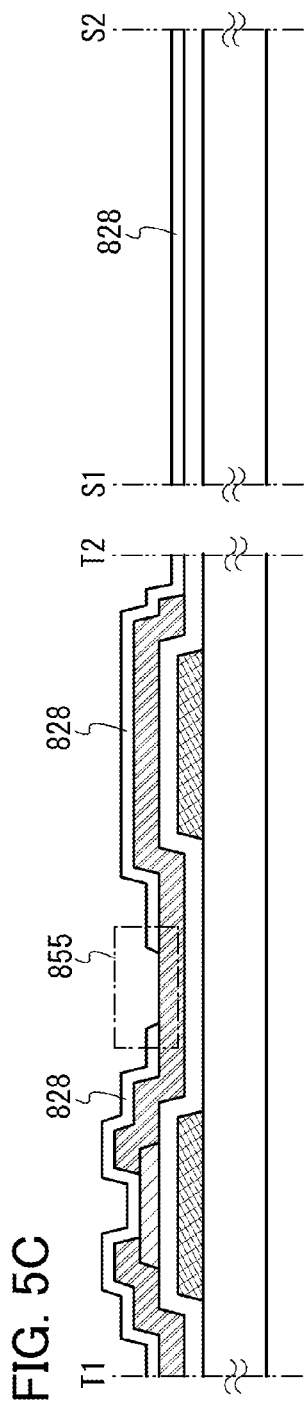

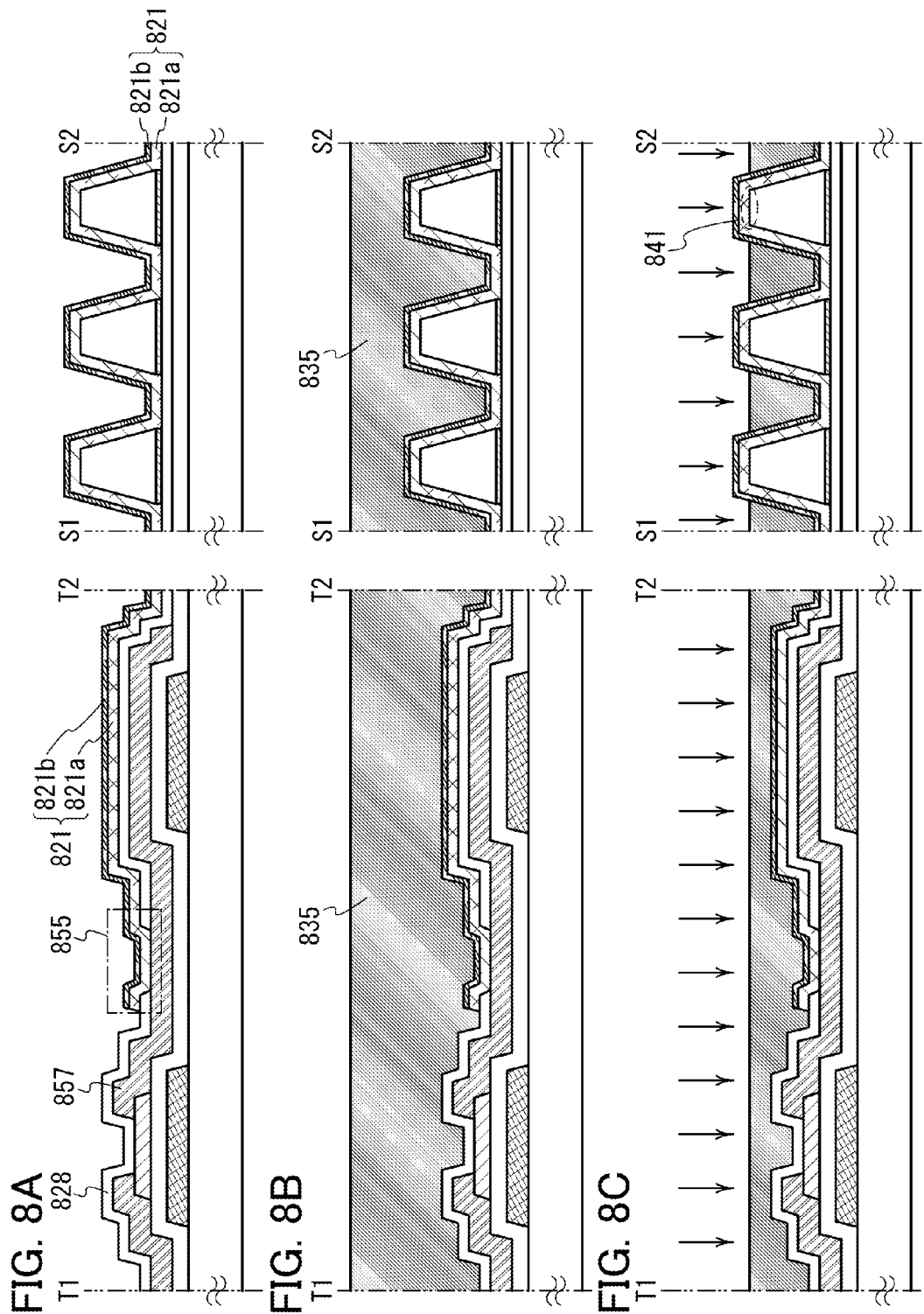

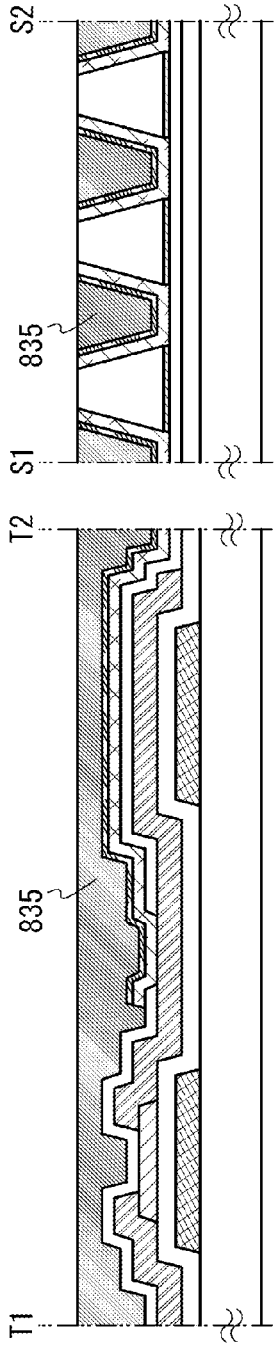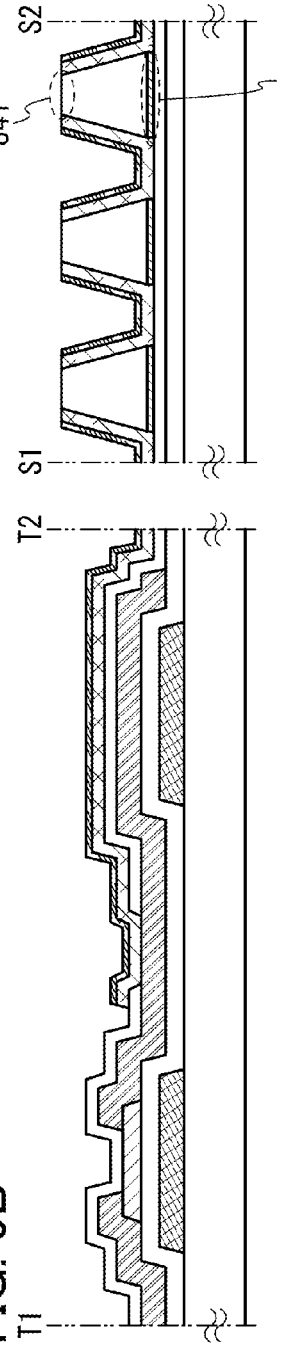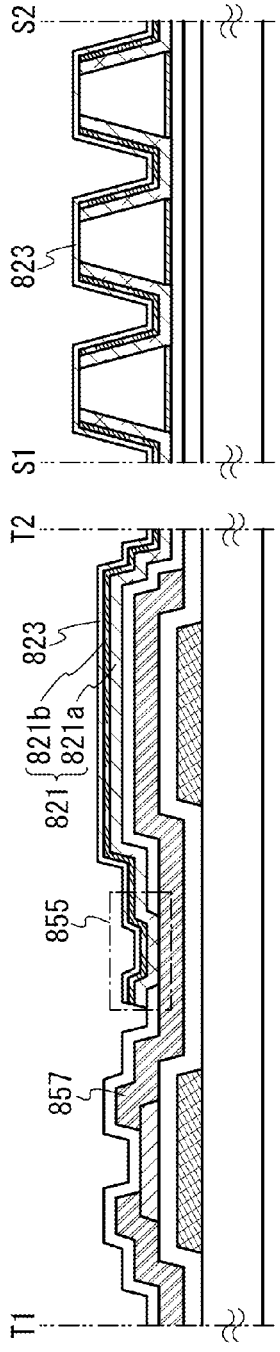

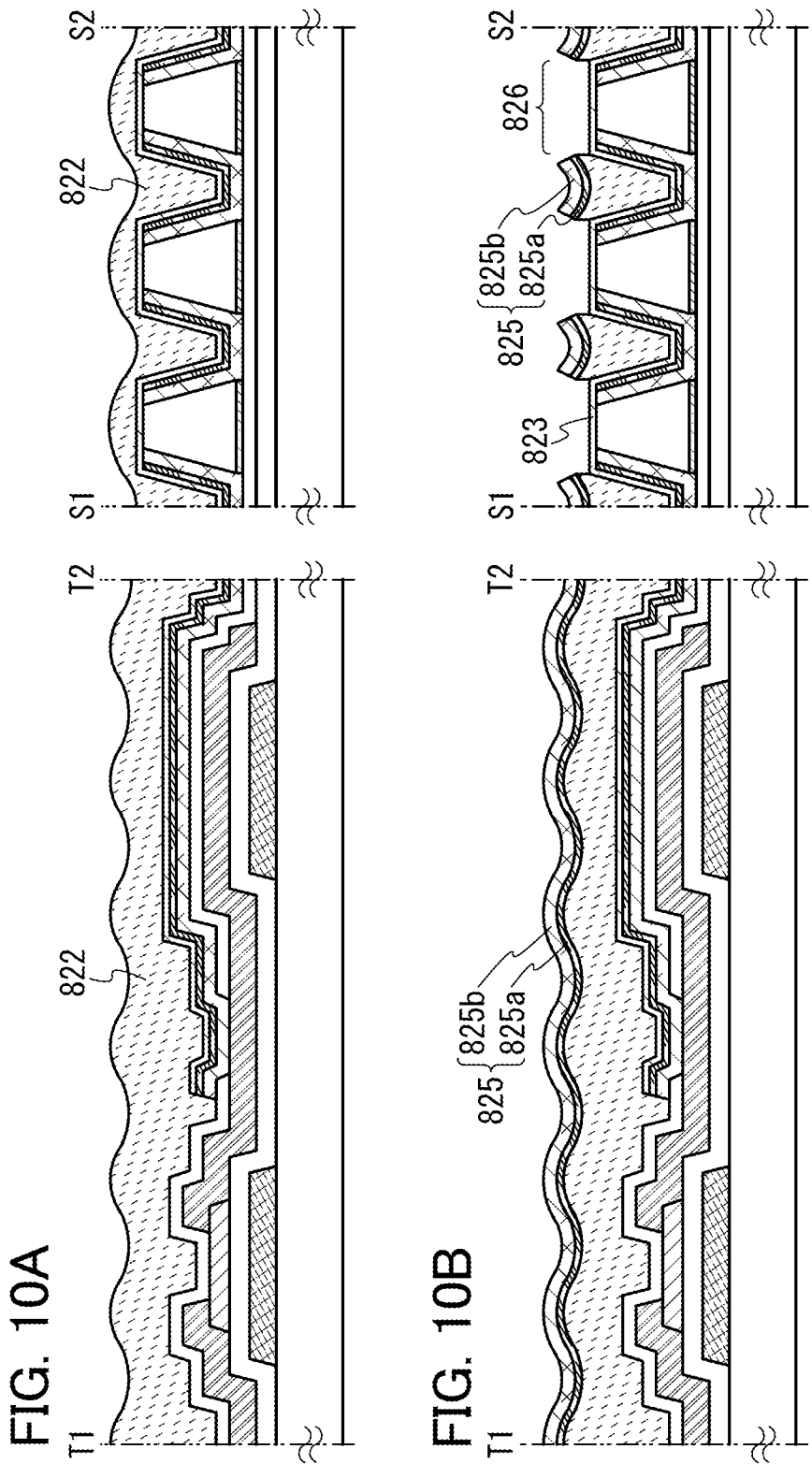

0
SEMICONDUCTOR DEVICE AND MANUFACTURING METHOD THEREOF

CROSS-REFERENCE TO RELATED APPLICATIONS

This application is a continuation of U.S. application Ser. No. 13/030,199, filed Feb. 18, 2011, now allowed, which claims the benefit of a foreign priority application filed in Japan as Serial No. 2010-043185 on Feb. 26, 2010, both of which are incorporated by reference.

BACKGROUND OF THE INVENTION

1. Field of the Invention

The present invention relates to a semiconductor device having a circuit formed using a transistor and a manufacturing method thereof. For example, the present invention relates to an electronic device on which an electro-optical device typified by a liquid crystal display device is mounted as a component.

In this specification, a semiconductor device means all types of devices that can function by utilizing semiconductor characteristics, and an electro-optic device, a semiconductor circuit, and electronic equipment are all semiconductor devices.

2. Description of the Related Art

As a liquid crystal display device, an active matrix liquid crystal display device in which pixel electrodes are arranged in matrix and transistors are used as switching elements connected to respective pixel electrodes in order to obtain a high-quality image, has attracted attention.

An active matrix liquid crystal display device, in which a transistor formed using a metal oxide for a channel formation region is used as a switching element connected to each pixel electrode, has already been known (see Patent Document 1 and Patent Document 2).

It is known that an active matrix liquid crystal display device is classified into two major types: transmissive type and reflective type.

In the transmissive liquid crystal display device, a backlight such as a cold cathode fluorescent lamp is used and an optical modulation operation of liquid crystal is utilized to choose one between the two states: a state in which light from the backlight passes through liquid crystal to be output to the outside of the liquid crystal display device and a state in which light is not output, whereby bright and dark images are displayed; further, image display is performed in combination of these.

Since the backlight is utilized in the transmissive liquid crystal display device, it is difficult to recognize display in the environment with strong external light, for example, outdoors.

In the reflective liquid crystal display device, the optical modulation operation of liquid crystal is utilized to choose between the two states: a state in which external light, that is, incident light is transmitted through liquid crystal and reflected on a pixel electrode to be output to the outside of the device and a state in which incident light is not output to the outside of the device, whereby bright and dark images are displayed; further, image display is performed in combination of them.

Compared to the transmissive liquid crystal display device, the reflective liquid crystal display device has the advantage of low power consumption since the backlight is not used; therefore, a demand for the reflective liquid crystal display device as a portable information terminal has increased.

Since external light is utilized in the reflective liquid crystal display device, the reflective liquid crystal display device is suited for image display in the environment with strong external light, for example, outdoors. On the other hand, it is difficult to recognize display when the liquid crystal display device is used in a dim environment, that is, in the environment with weak external light.

REFERENCE

Patent Document

[Patent Document 1] Japanese Published Patent Application No. 2007-123861
[Patent Document 2] Japanese Published Patent Application No. 2007-096055

SUMMARY OF THE INVENTION

It is an object to provide a semiconductor device of which image display can be favorably recognized.

It is another object to provide a semiconductor device that can perform image display in both modes: a reflective mode where external light is utilized as an illumination light source; and a transmissive mode where a backlight is used.

It is another object to provide a semiconductor device with bright and high-quality display without increasing power consumption.

It is another object to provide a manufacturing method of a semiconductor device with high productivity and less variation in characteristics.

One embodiment of the invention disclosed in this specification achieves at least one of the above objects.

The semiconductor device includes a light-transmitting pixel and a pixel that reflects incident light through a liquid crystal layer; therefore, display image can be performed in both modes: the reflective mode in which external light is utilized as an illumination light source; and the transmissive mode in which a backlight is used as an illumination light source.

A plurality of structures for condensing light from the backlight is provided in the light-transmitting pixel, whereby the amount of transmitted light can be increased without increasing the luminance of the backlight.

In addition, by forming the structure over the oxide semiconductor, the oxide semiconductor functions as an etching-stop layer and damage to a bottom layer in the formation process of the structure is reduced; therefore, a semiconductor device having high productivity and less variation in characteristics can be manufactured. As a material of the etching-stop layer, a conductive material, an insulating material, or a semiconductor material can be used as long as it is a light-transmitting material that can withstand an etching process in the formation process of the structure. The etching-stop layer can be referred to as a light-transmitting layer or a light-condensing layer.

A semiconductor device of an embodiment of the present invention includes a structure comprising a side surface, a bottom surface and a top surface, a first pixel electrode including an electrode that reflects incident light, and a second pixel electrode including an electrode that has a light-transmitting property. The first pixel electrode is connected to a first transistor, and the second pixel electrode is connected to a second transistor. The side surface of the structure is covered by a reflective layer, and the area of the bottom surface of the structure is greater than that of the top surface of the structure.

A transistor including an oxide semiconductor is used as each of the first transistor and the second transistor, whereby frequency of refresh operation in displaying a still image can be reduced.

Each structure is formed so that the bottom surface of each structure is in contact with and on a light-transmitting layer. The structure has preferably higher refractive index than the light-transmitting layer.

The structure is preferably formed using an organic resin such as a polyimide resin or an acrylic resin.

As a material of the reflective layer, a material with high reflectance of visible light such as aluminum (Al) or silver (Ag), or an alloy including any of these is preferably used.

Each structure includes two inclined planes facing each other at a cross section of each structure. An angle θR formed by the two inclined planes of the structure is less than 90°, preferably greater than or equal to 10° and less than or equal to 60°.

The reflective pixel that reflects incident light includes a reflective electrode, the reflective electrode includes a curving surface, and an angle θR at point where the reflective electrode is most curved at the cross section of the reflective electrode, formed by two inclined planes facing each other is greater than or equal to 90°, preferably greater than or equal to 100° and less than or equal to 120°.

An embodiment of the present invention is a manufacturing method of a semiconductor device including the steps of: forming an insulating layer over a substrate; forming a light-transmitting etching-stop layer over the insulating layer; forming an organic resin layer over the etching-stop layer; etching the organic resin layer selectively to expose the etching-stop layer; and forming a plurality of structures by etching the exposed etching-stop layer.

An embodiment of the present invention is a manufacturing method of a semiconductor device including the steps of: forming a first insulating layer over a substrate; forming an etching-stop layer over the first insulating layer; forming a second insulating layer over the etching-stop layer; forming a resist mask over the second insulating layer; and forming a plurality of structures by etching the resist mask while etching the second insulating layer.

An oxide semiconductor is preferably used for the etching-stop layer because the selectivity in formation of the structures can be increased.

The second insulating layer is preferably formed using an organic resin such as a polyimide resin or an acrylic resin.

The second insulating layer is preferably etched by a dry etching method.

The etching-stop layer that is exposed by the etching of the second insulating layer is preferably removed by a wet etching method.

A semiconductor device with bright and high-quality display can be provided. A semiconductor device with high productivity and less variation in characteristics can be provided.

BRIEF DESCRIPTION OF THE DRAWINGS

In the accompanying drawings:

FIGS. 4A to 4C are cross-sectional views illustrating a manufacturing process of the semiconductor device;

FIGS. 5A to 5C are cross-sectional views illustrating the manufacturing process of the semiconductor device;

FIGS. 8A to 8C are cross-sectional views illustrating the manufacturing process of the semiconductor device;

FIGS. 9A to 9C are cross-sectional views illustrating the manufacturing process of the semiconductor device;

FIGS. 10A and 10B are cross-sectional views illustrating the manufacturing process of the semiconductor device;

DETAILED DESCRIPTION OF THE INVENTION

Figure 1A:
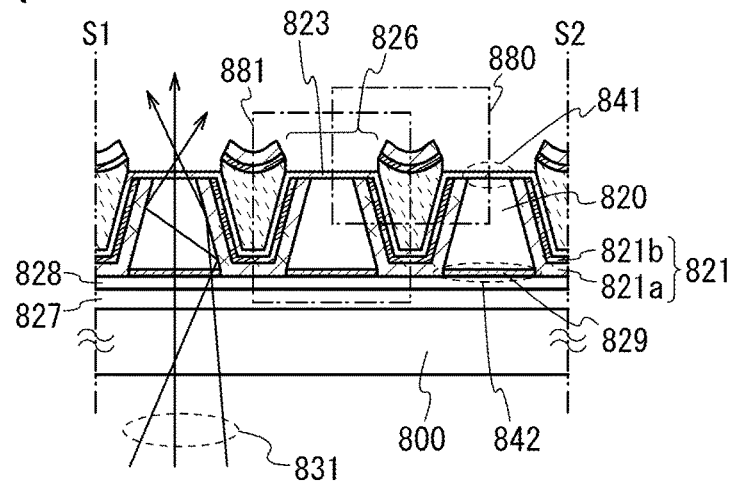
FIGS. 1A to 1C are diagrams each illustrating a cross-sectional structure of a semiconductor device.

Hereinafter, embodiments of the present invention will be described in detail with reference to the drawings. Note that the present invention is not limited to the following description and it will be readily appreciated by those skilled in the art that modes and details can be modified in various ways. Further, the invention should not be construed as being limited to the description in the following embodiments.

A transistor is a kind of semiconductor elements and can achieve amplification of a current or a voltage, switching operation for controlling conduction or non-conduction, or the like. A transistor in this specification includes an insulated-gate field effect transistor (IGFET) and a thin film transistor (TFT).

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like. In addition, in a circuit diagram, "OS" is written beside a transistor in order to indicate that the transistor includes an oxide semiconductor.

In this specification and the like, ordinal numbers such as "first", "second", and "third" are used in order to avoid confusion among components, and the terms do not mean limitation of the number of components.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

Further, in this specification, a source electrode and a drain electrode of a transistor may be interchanged with each other depending on the structure, the operating condition, or the like of the transistor; therefore, it is difficult to define which is a source electrode or a drain electrode in electrodes of the transistor other than a gate electrode. Therefore, the terms "source electrode" and "drain electrode" can be switched in this specification.

In this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Note that when it is explicitly described that "A and B are connected", the case where A and B are electrically connected, the case where A and B are functionally connected, and the case where A and B are directly connected are included therein.

Embodiment 1

In this embodiment, a pixel structure which enables an increase in the amount of reflected light and transmitted light per one pixel in a semi-transmissive liquid crystal display device and a manufacturing method thereof will be described with reference to FIGS. 1A to 1C, FIGS. 2A and 2B, FIG. 3, FIGS. 4A to 4C, FIGS. 5A to 5C, FIGS. 6A and 6B, FIGS. 7A to 7C, FIGS. 8A to 8C, FIGS. 9A to 9C, and FIGS. 10A and 10B.

Figure 1B:
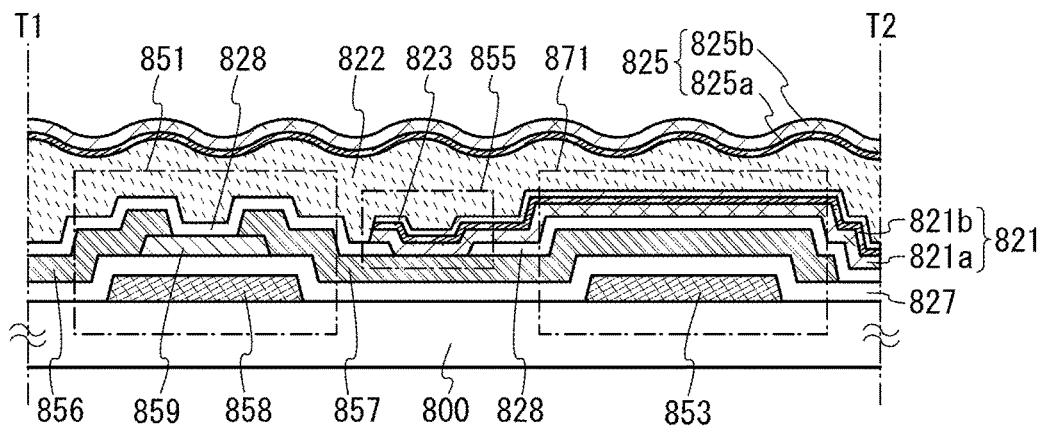
Figure 1C:
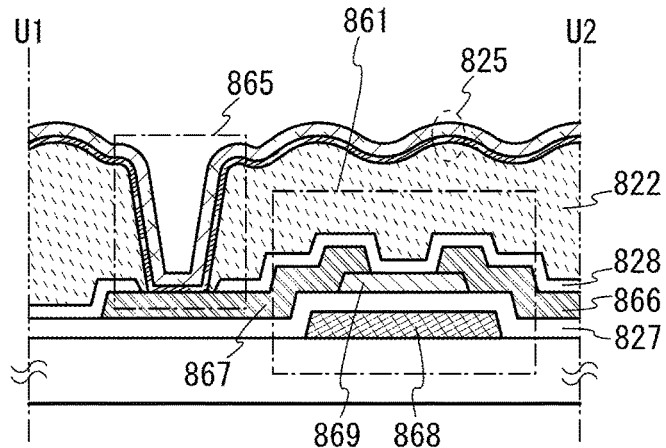
Figure 2A:
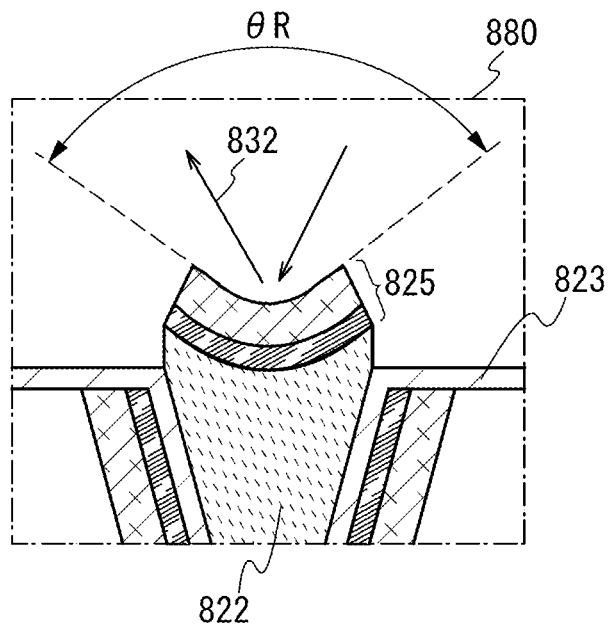
FIGS. 2A and 2B are diagrams each illustrating a cross-sectional structure of a semiconductor device.
Figure 2B:
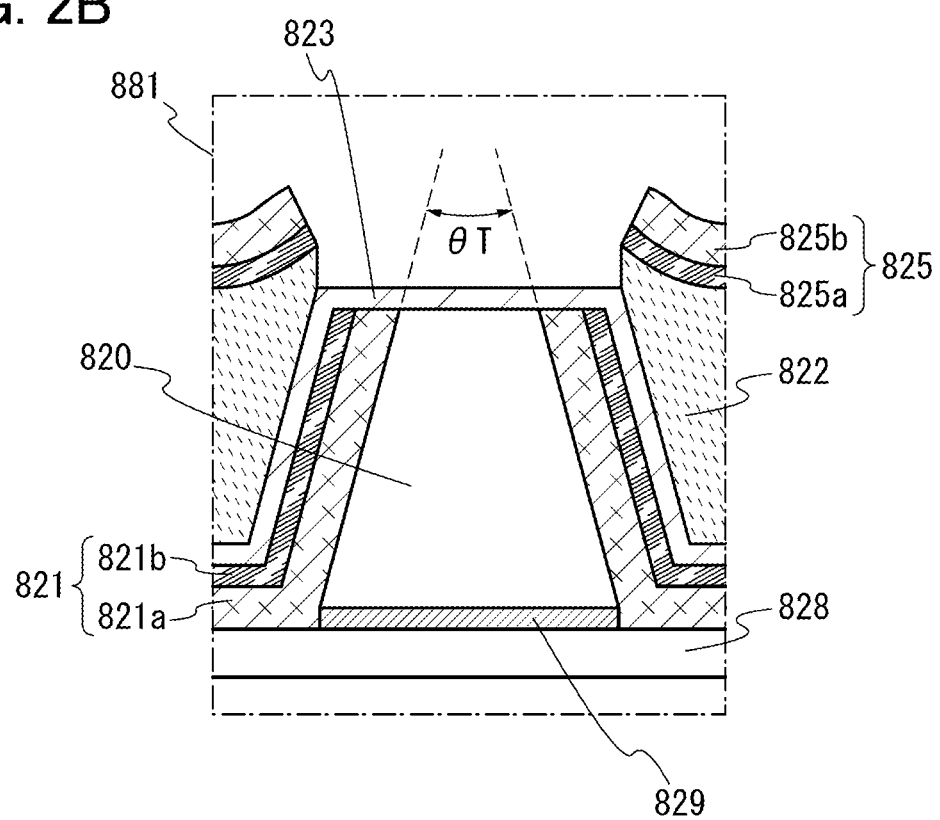
Figure 3:
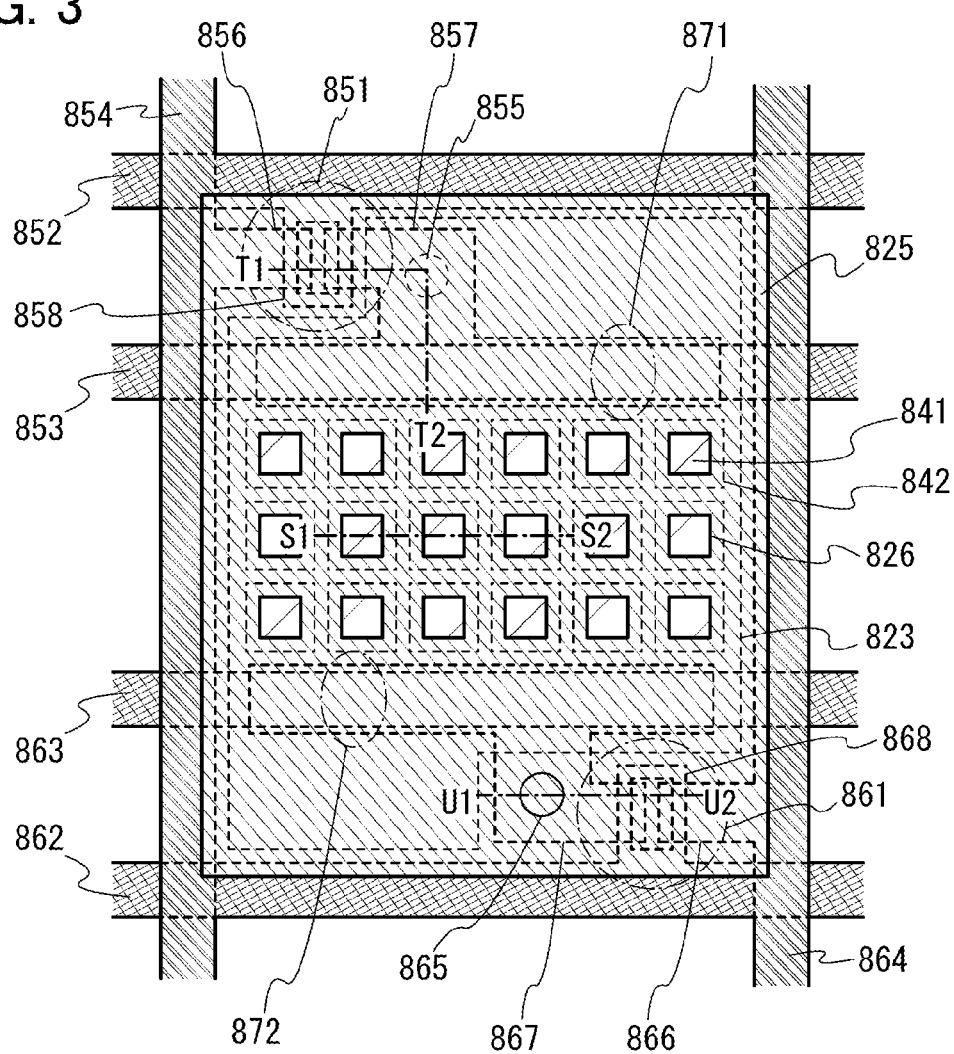
FIG. 3 is a diagram illustrating a plane structure of a semiconductor device.

FIGS. 1A to 1C and FIGS. 2A and 2B illustrate cross-sectional structures of a pixel described in this embodiment. FIG. 3 illustrates a plane structure of the pixel described in this embodiment. FIGS. 1A to 1C illustrate cross-sectional structures of a portion along S1-S2, a portion along T1-T2, and a portion along U1-U2, respectively, denoted by dashed lines in FIG. 3. FIG. 2A is an enlarged view of a portion 880 in FIG. 1A. FIG. 2B is an enlarged view of a portion 881 in FIG. 1A.

The pixel described in this embodiment includes a transparent electrode 823 and a reflective electrode 825 as pixel electrodes. The transparent electrode 823 and a reflective layer 821 are connected to a drain electrode 857 of a transistor 851 through a contact hole 855 provided in an insulating layer 828. Note that the transparent electrode 823 can be directly connected to the drain electrode 857. The drain electrode 857 overlaps with a capacitor wiring 853 with the insulating layer 827 provided therebetween so that a storage capacitor 871 is formed (see FIG. 1B and FIG. 3).

A gate electrode 858 of the transistor 851 is connected to a wiring 852, and a source electrode 856 of the transistor 851 is connected to a wiring 854 (see FIG. 3). The transistor 851 includes a semiconductor layer 859. As the semiconductor layer 859, for example, an amorphous semiconductor, a microcrystalline semiconductor, or polycrystalline semiconductor containing silicon or germanium, or the like can be used. Alternatively, an organic semiconductor formed by a printing method or an inkjet method can be used. With the use of an oxide semiconductor, the transistor 851 can have an extremely low off-state current, so that display quality can be increased.

The reflective electrode 825 is connected to a drain electrode 867 of a transistor 861 through a contact hole 865 provided in the insulating layer 828 and an organic resin layer 822 (see FIG. 1C). The drain electrode 867 overlaps with a capacitor wiring 863 with the insulating layer 827 provided therebetween to form a storage capacitor 872.

A gate electrode 868 of the transistor 861 is connected to a wiring 862, and a source electrode 866 of the transistor 861 is connected to a wiring 864. The transistor 861 includes a semiconductor layer 869. As the semiconductor layer 869, for example, an amorphous semiconductor, a microcrystalline semiconductor, or polycrystalline semiconductor containing silicon or germanium, or the like can be used. Alternatively, an organic semiconductor formed by a printing method or an inkjet method can be used. With the use of an oxide semiconductor, the transistor 861 can have an extremely low off-state current, so that display quality can be increased.

External light is reflected by the reflective electrode 825, so that the pixel electrode can function as a pixel electrode of a reflective liquid crystal display device (a reflective mode). A plurality of openings 826 is provided in the reflective electrode 825 (see FIG. 1A or FIG. 3). In each opening 826, the reflective electrode 825 does not exist, and the transparent electrode 823 is exposed (see FIG. 1A). Light from a backlight is transmitted through the structure 820 from the opening 826, so that the transparent electrode 823 can function as a pixel electrode of a transmissive liquid crystal display device (a transmissive mode).

In the semi-transmissive liquid crystal display device described in this embodiment, the reflective electrode 825 and the transparent electrode 823 are electrically isolated by the organic resin layer 822. The potential applied to the transparent electrode 823 can be controlled by the transistor 851, and the potential applied to the reflective electrode 825 can be controlled by the transistor 861; therefore, the potential of the reflective electrode 825 and the potential of the transparent electrode 823 can be controlled independently. Accordingly, for example, when the semi-transmissive liquid crystal display device functions as a transmissive liquid crystal display device, the image displayed using a liquid crystal display over the reflective electrode can be black.

Reflected light 832 is external light reflected by the reflective electrode 825 (see FIG. 2A). The top surface of the organic resin layer 822 is a curving surface with an uneven shape (see FIGS. 1A to 1C). The reflective electrode 825 also has the curving surface with an uneven shape; thus, the area of the reflective region can be increased, and glare of the outside light can be reduced so that visibility of the displayed image can be improved.

In the cross-sectional shape, the angle θR at a point where the reflective electrode 825 having a curving surface is most curved, formed by two inclined planes facing each other may be greater than or equal to 90°, preferably greater than or equal to 100° and less than or equal to 120° (see FIG. 2A).

The structure 820 is formed in a lower layer of the opening 826 to overlap with the opening 826 (see FIG. 1A).

The structure 820 includes a backlight exit 841 on the opening 826 side (a top surface side of the structure 820) and a backlight entrance 842 on a substrate 800 side (a bottom surface side of the structure 820). The area of the backlight entrance 842 (the area of the bottom surface of the structure 820) is larger than the area of the backlight exit 841 (the area of the top surface of the structure 820). The reflective layer

821 is formed on the side surfaces of the structure 820 (surfaces other than the backlight exit 841 and the backlight entrance 842). As a material for the structure 820, an inorganic material or an organic resin material can be used as long as it is a light-transmitting material such as silicon oxide ($SiO_x$), silicon nitride ($SiN_x$), silicon oxynitride (SiNO), an acrylic resin, a polyimide resin, a siloxane resin, phosphosilicate glass (PSG), or borophosphosilicate glass (BPSG). The reflective layer 821 can be formed using a material with high reflectance of visible light such as aluminum (Al) or silver (Ag), or an alloy including any of these. An etching-stop layer 829 is provided between the structure 820 and the insulating layer 828 (see FIG. 1A and FIG. 2B).

Light emitted from the backlight enters the structure 820 through the backlight entrance 842 as incident light 831. Some of the incident light 831 is directly transmitted through the backlight exit 841, some is reflected toward the backlight exit 841 by the reflective layer 821, and some is further reflected to return to the backlight entrance 842.

Here, according to the shape of a cross section of the structure 820 from a direction perpendicular to the substrate 800, side surfaces on right and left facing each other are inclined surfaces. The angle θT formed by the side surfaces facing each other is made to be less than 90°, preferably greater than or equal to 10° and less than or equal to 60°, so that the incident light 831 incident from the backlight entrance 842 can be guided efficiently to the backlight exit 841. The structure 820 has a function of condensing the incident light 831 incident from the backlight entrance 842 and guiding the light to the backlight exit 841.

The etching-stop layer 829 is used to prevent the insulating layer 828 in the bottom layer from being removed by etching in a process of formation of the structure 820, and details thereof will be described in the description of a manufacturing process below. As the etching-stop layer 829, a material that is not easily etched (a high etching selectivity is obtained) in the process of the formation of the structure 820 is used. As the etching-stop layer 829, a light-transmitting material is used because the etching-stop layer 829 remains between the structure 820 and the insulating layer 828. For that reason, the etching-stop layer can be referred to as a light-transmitting layer.

Here, when a material with a higher refractive index than a material of the insulating layer 828 is used for the etching-stop layer 829, in accordance with Snell's law, the incident light 831 can be guided efficiently to the backlight exit 841. This is because, among the incident light 831 incident from the insulating layer 828 to the etching-stop layer 829, incident light with an incidence angle i (an angle formed by the incident light and a normal to the interface between the insulating layer 828 and the etching-stop layer 829) is guided to the structure 820 as refractive light with a refraction angle j (an angle formed by the refractive light a normal to the interface between the insulating layer 828 and the etching-stop layer 829) which is a shallower than the angle i. That is, the etching-stop layer 829 can function as a light-condensing layer. In addition, when a material with a higher refractive index than that of the etching-stop layer 829 is used for the structure 820, the above effect can be further increased.

In a conventional semi-transmissive liquid crystal display device, when the area of an electrode in a pixel electrode, functioning as a reflective electrode is SR and the area of an electrode in a pixel electrode, functioning as a transmissive electrode (the area of the opening 826) is ST, the proportion of the total area of both electrodes is 100% (SR+ST=100%) of an effective pixel area. In the semi-transmissive liquid crystal display device having a pixel structure described in this embodiment, since the area ST of the electrode functioning as a transmissive electrode corresponds to the area of the backlight entrance 842, the amount of transmitted light can be increased without increasing the area of the opening 826 or the luminance of the backlight. In other words, the proportion of the total area of both electrodes in appearance can be 100% or more (SR+ST is 100% or more) comparing an effective pixel area.

With this embodiment, a semi-transmissive liquid crystal display device with bright and high-quality display can be obtained without increasing power consumption.

Next, a manufacturing process of the semiconductor device described in this embodiment will be described with reference to FIGS. 4A to 4C, FIGS. 5A to 5C, FIGS. 6A and 6B, FIGS. 7A to 7C, FIGS. 8A to 8C, FIGS. 9A to 9C, and FIGS. 10A and 10B.

First, a conductive layer is formed over the light-transmitting substrate 800, and then, the gate electrode 858 and the capacitor wiring 853 are formed by a first photolithography step. Note that a resist mask may be formed by an inkjet method. Formation of the resist mask by an inkjet method needs no photomask; thus, manufacturing cost can be reduced.

As the substrate 800, a glass substrate, a ceramic substrate, a quartz substrate, a sapphire substrate, a plastic substrate having heat resistance high enough to withstand a treatment temperature in this manufacturing process, or the like can be used. Alternatively, crystallized glass or the like may be used.

When the temperature of the heat treatment performed later is high, a substrate having a strain point of 730° C. or higher is preferably used as the glass substrate. As the glass substrate, for example, an alkali-free glass substrate of barium borosilicate glass, aluminoborosilicate glass, aluminosilicate glass, or the like may be used. Note that when the glass substrate contains more barium oxide (BaO) than boron oxide ($B_2O_3$), a more practical heat-resistant glass can be obtained. Therefore, a glass substrate containing BaO and $B_2O_3$ so that the amount of BaO is larger than that of $B_2O_3$ is preferably used.

Further, an insulating layer as a base insulating layer may be provided between the substrate 800 and the gate electrode 858 and between the substrate 800 and the capacitor wiring 853. The base insulating layer has a function of preventing diffusion of an impurity element from the substrate 800, and can be formed with a single-layer or stacked-layer structure using one or more of a silicon nitride layer, a silicon oxide layer, a silicon nitride oxide layer, and a silicon oxynitride layer.

When a halogen element such as chlorine or fluorine is contained in the base insulating layer, the function of preventing diffusion of an impurity element from the substrate 800 can be further increased. The peak of the concentration of a halogen element to be contained in the base insulating layer is preferably greater than or equal to $1 \times 10^{15}/cm^3$ and less than or equal to $1 \times 10^{20}/cm^3$ when measured by secondary ion mass spectrometry (SIMS).

The conductive layers for forming the gate electrode 858 and the capacitor wiring 853 can be formed with a single-layer or stacked-layer structure using a metal material such as molybdenum, titanium, tantalum, tungsten, aluminum, copper, neodymium, or scandium, or an alloy material containing any of these materials as its main component. For example, the metal conductive film may have a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Further, an aluminum material to which an element that prevents generation of a hillock or a whisker in an aluminum layer (such as silicon, neodymium, or scandium) is added can be used for an aluminum layer, so that heat resistance can be increased.

The etching of the conductive layer may be performed by either a dry etching method or a wet etching method. For dry etching, an excitation method such as an inductively coupled plasma (ICP) etching method using a gas containing chlorine or fluorine as an etching gas can be used.

The thickness of the gate electrode 858 and the capacitor wiring 853 is preferably greater than or equal to 50 nm and less than or equal to 500 nm. The end portions of the gate electrode 858 and the capacitor wiring 853 are tapered, whereby coverage with the insulating layer 827 formed later can be improved and disconnection can be prevented. In this embodiment, a 100-nm-thick tungsten film is used as a conductive film forming the gate electrode 858 and the capacitor wiring 853 (see FIG. 4A).

Next, the insulating layer 827 is formed over the gate electrode 858 and the capacitor wiring 853. The insulating layer 827 can be formed with a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like.

For example, a silicon oxynitride layer may be formed using $SiH_4$, oxygen, and nitrogen as deposition gases by a plasma CVD method. When a silicon oxide film is formed by a sputtering method, a silicon target or a quartz target is used as a target and oxygen or a mixed gas of oxygen and argon is used as a sputtering gas.

The thickness of the insulating layer 827 is greater than or equal to 100 nm and less than or equal to 500 nm; when the insulating layer 827 is formed using a stacked layer, for example, a first insulating layer with a thickness of greater than or equal to 50 nm and less than or equal to 200 nm and a second insulating layer with a thickness of greater than or equal to 5 nm and less than or equal to 300 nm are stacked. In this embodiment, the insulating layer 827 is formed of a 100-nm-thick silicon oxynitride layer (see FIG. 4B).

Note that when an oxide semiconductor that is made to be an i-type or substantially i-type by removing impurities is used for the semiconductor layer 859 formed later, the insulating layer 827 that is in contact with the highly purified oxide semiconductor needs to have higher quality. This is because such a highly purified oxide semiconductor is highly sensitive to an interface state and interface electric charge.

For example, a high-density plasma CVD method using microwaves (e.g., a frequency of 2.45 GHz) is preferably adopted because an insulating layer can be dense and can have high withstand voltage and high quality. The highly-purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as a high-quality insulating layer can be formed as a gate insulating layer. Further, an insulating layer whose film quality as a gate insulating layer and characteristics of the interface between the insulating layer and an oxide semiconductor are improved by heat treatment that is performed after formation of the insulating layer may be formed. In any case, any insulating layer may be used as long as the insulating layer has characteristics of enabling a reduction in interface state density of the interface between the insulating layer and an oxide semiconductor and formation of a favorable interface as well as having favorable film quality as a gate insulating layer.

Next, over the insulating layer 827, a semiconductor layer having a thickness greater than or equal to 2 nm and less than or equal to 200 nm, preferably greater than or equal to 5 nm and less than or equal to 30 nm is formed.

The semiconductor layer can be formed of a semiconductor layer with an amorphous, microcrystalline, or polycrystalline crystal structure by a known method such as a CVD method, a sputtering method, or a laser annealing method. For example, a layer of an amorphous semiconductor or a microcrystalline semiconductor can be formed using a deposition gas diluted with hydrogen by a plasma CVD method. As a deposition gas, a gas containing silicon or germanium can be used. As a deposition gas containing silicon, silane ($SiH_4$), disilane ($Si_2H_6$), dichlorosilane ($SiH_2Cl_2$), trichlorosilane ($SiHCl_3$), silicon chloride ($SiCl_4$), silicon fluoride ($SiF_4$), or the like can be used. As a deposition gas containing germanium, germane ($GeH_4$), digermane ($Ge_2H_6$), germane fluoride ($GeF_4$), or the like can be used.

A polycrystalline semiconductor can be formed by forming an amorphous semiconductor or a microcrystalline semiconductor and then subjecting the semiconductor to heat treatment at 600° C. or more, RTA treatment, or laser light irradiation. Crystallization by RTA treatment or laser light irradiation, by which a semiconductor layer can be instantaneously heated, is particularly effective in the case of forming a polycrystalline semiconductor over a substrate having a low strain point.

Alternatively, the oxide semiconductor can be formed by a sputtering method in a rare gas (typically, argon) atmosphere, an oxygen atmosphere, or a mixed atmosphere of a rare gas and oxygen. Note that a pulse direct current (DC) power source is preferably used as a power source because powder substances (also referred to as particles or dust) generated in film formation can be reduced and the film thickness can be uniform.

As an oxide semiconductor used for the oxide semiconductor film, the following can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor which are two-component metal oxides; or an In—O-based oxide semiconductor, a Sn—O-based oxide semiconductor, or a Zn—O-based oxide semiconductor. Further, $SiO_2$ may be contained in the above oxide semiconductor. Here, for example, an In—Ga—Zn—O-based oxide semiconductor is an oxide including at least In, Ga, and Zn, and there is no particular limitation on the composition ratio thereof. Further, the In—Ga—Zn—O-based oxide semiconductor may contain an element other than In, Ga, and Zn.

For the oxide semiconductor, a thin film represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

When an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when a target used for forming the In—Zn—O-based oxide semiconductor has a composition ratio of In:Zn:O=x:y:z in an atomic ratio, Z>(1.5x+y).

In this embodiment below, an example in which the oxide semiconductor is formed using an In—Ga—Zn—O-based oxide semiconductor target by a sputtering method as a semiconductor layer will be described.

Note that the oxide semiconductor used for the semiconductor layer in this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen, which is an n-type impurity, is removed from an oxide semiconductor, and the oxide semiconductor is highly purified so that impurities that are not main components of the oxide semiconductor are contained as little as possible. In other words, a feature is that a purified i-type (intrinsic) semiconductor or a semiconductor close thereto is obtained not by adding an impurity but by removing an impurity such as hydrogen or water as much as possible. Thus, an oxide semiconductor layer included in the transistor described in this embodiment is highly purified to become electrically i-type (intrinsic).

In addition, a highly purified oxide semiconductor includes extremely few carriers (close to zero), and the carrier density thereof is lower than $1 \times 10^{14}/cm^3$, preferably lower than $1 \times 10^{12}/cm^3$, further preferably lower than $1 \times 10^{11}/cm^3$.

Since the oxide semiconductor includes extremely few carriers, off-state current of a transistor can be reduced. The smaller the amount of off-state current is, the better.

Specifically, in a transistor including the above-described oxide semiconductor layer, the off-state current density per channel width of 1 μm at room temperature can be reduced to less than or equal to 10 aA/μm ($1 \times 10^{-17}$ A/μm), further to less than or equal to 1 aA/μm ($1 \times 10^{-18}$ A/μm), still further to less than or equal to 10 zA/μm ($1 \times 10^{-20}$ A/μm). Although it is difficult to achieve such a low off-state current with a transistor including a general silicon semiconductor, it can be achieved with a transistor including an oxide semiconductor that is processed under an appropriate condition and has a large energy gap of 3.0 eV to 3.5 eV.

By using a transistor with an extremely small current value in an off state (off-state current) as a transistor in a pixel portion, a refresh operation in displaying a still image can be performed with a small number of times of writing of image data.

In addition, in the transistor including the oxide semiconductor layer, the temperature dependence of on-state current is hardly observed, and the off-state current remains extremely small.

As the metal oxide target used for forming an oxide semiconductor layer with a sputtering method, for example, a metal oxide target having a composition ratio of $In_2O_3$:$Ga_2O_3$:ZnO=1:1:1[molar ratio] can be used. There is no limitation to the material and the composition of the above target, for example, a target having a composition ratio of $In_2O_3$:$Ga_2O_3$:ZnO=1:1:2 [molar ratio], $In_2O_3$:$Ga_2O_3$:ZnO=2:2:1 [molar ratio], or $In_2O_3$:$Ga_2O_3$:ZnO=1:1:4 [molar ratio] may be used. The filling rate of the metal oxide target is greater than or equal to 90% and less than or equal to 100%, preferably greater than or equal to 95% and less than or equal to 99.9%. With the use of the metal oxide target with high filling rate, a dense oxide semiconductor film is formed.

It is preferable that a high-purity gas in which impurities such as hydrogen, water, a hydroxyl group, and hydride are removed be used as the sputtering gas for the formation of the oxide semiconductor film.

In order that hydrogen, hydroxyl group, and moisture are contained as little as possible in the insulating layer 827 and the semiconductor layer, it is preferable that as pretreatment before film formation of an oxide semiconductor, the substrate 800 over which the gate electrode 858 and the capacitor wiring 853 are formed, or the substrate 800 over which layers up to and including the insulating layer 827 are formed be preheated in a preheating chamber of a sputtering apparatus, so that impurities such as hydrogen or moisture absorbed onto the substrate are eliminated and removed. As an exhaustion unit provided for the preheating chamber, a cryopump is preferable. Note that this preheating treatment can be omitted. In addition, before the insulating layer 828 is formed, the preheating may similarly be performed on the substrate 800 over which layers up to and including the source electrode 856 and the drain electrode 857 are formed.

When the oxide semiconductor film is deposited, the substrate is held in a deposition chamber kept under reduced pressure, and the substrate temperature is set to temperatures higher than or equal to 100° C. and lower than or equal to 600° C., preferably higher than or equal to 200° C. and lower than or equal to 400° C. By heating the substrate during deposition, the impurity concentration in the oxide semiconductor layer that is formed can be reduced. In addition, damage by sputtering can be reduced. Then, residual moisture in the deposition chamber is removed, a sputtering gas from which hydrogen and moisture are removed is introduced, and the above-described target is used, so that the oxide semiconductor film is formed. In order to remove the residual moisture in the deposition chamber, an entrapment vacuum pump, for example, a cryopump, an ion pump, or a titanium sublimation pump is preferably used. The evacuation unit may be a turbo pump provided with a cold trap. In the deposition chamber which is evacuated with the cryopump, a hydrogen atom, a compound containing a hydrogen atom, such as water ($H_2O$), (further preferably, also a compound containing a carbon atom), and the like are evacuated, whereby the concentration of an impurity in the oxide semiconductor layer formed in the deposition chamber can be reduced.

Further, the insulating layer 827 and the oxide semiconductor film may be formed successively without exposure to the air. Film formation without exposure to air makes it possible to obtain an interface between the stacked layers, which is not contaminated by atmospheric components or impurity elements floating in the air, such as water or hydrocarbon. Therefore, variation in characteristics of the transistor can be reduced.

Next, the semiconductor layer 859 is formed by processing the semiconductor layer into an island shape by a second photolithography step (see FIG. 4C). A resist mask for forming the island-shaped semiconductor layer may be formed by an inkjet method. Formation of the resist mask by an inkjet method needs no photomask; thus, manufacturing cost can be reduced.

Note that the etching of the semiconductor layer here may be performed by either one or both of a dry etching method and a wet etching method. As an etchant used for wet etching of the oxide semiconductor film, a solution obtained by mixing phosphoric acid, acetic acid, and nitric acid, an ammonia peroxide mixture, or the like can be used, for example. As the ammonia peroxide mixture, specifically, an aqueous solution in which oxygenated water of 31 wt %, ammonia water of 28 wt %, and water are mixed at a volume ratio of 2:1:1 is used. Alternatively, ITO-07N (produced by KANTO CHEMICAL CO., INC.) may be used.

Next, a first heat treatment is performed on the semiconductor layer 859. The oxide semiconductor layer can be dehydrated or dehydrogenated by the first heat treatment. The temperature of the first heat treatment is higher than or equal to 400° C. and lower than or equal to 750° C., or higher than or equal to 400° C. and lower than the strain point of the substrate. Here, the substrate is introduced into an electric furnace which is one of heat treatment apparatuses, heat treatment is performed on the semiconductor layer 859 in a nitrogen atmosphere at 450° C. for one hour, and then, the semiconductor layer 859 is not exposed to the air so that entry of water and hydrogen into the oxide semiconductor layer is prevented; thus, the dehydrated or dehydrogenated semiconductor layer 859 is obtained.

Note that a heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high temperature gas, an inert gas that does not react with an object to be processed by heat treatment, such as nitrogen or a rare gas like argon, is used.

For example, as the first heat treatment, GRTA may be performed as follows: the substrate is transferred and put in an inert gas heated at a high temperature higher than or equal to 650° C. and lower than or equal to 700° C., is heated for several minutes, and is transferred and taken out of the inert gas heated at the high temperature.

Note that in the first heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be higher than or equal to 6N (99.9999%), preferably higher than or equal to 7N (99.99999%) (that is, the impurity concentration is lower than or equal to 1 ppm, preferably lower than or equal to 0.1 ppm).

Further, after the semiconductor layer 859 is heated in the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. It is preferable that water, hydrogen, and the like be not contained in an oxygen gas or a $N_2O$ gas. It is preferable that the purity of the oxygen gas or the $N_2O$ gas which is introduced into the heat treatment apparatus be higher than or equal to 6N (99.9999%), preferably higher than or equal to 7N (99.99999%) (i.e., the concentration of impurities in the oxygen gas or the $N_2O$ gas is lower than or equal to 1 ppm, preferably lower than or equal to 0.1 ppm). Oxygen which is a main component included in the oxide semiconductor and which has been reduced because of the step of removing impurities by dehydration or dehydrogenation is supplied by the action of the oxygen gas or the $N_2O$ gas, so that the semiconductor layer 859 can be a highly-purified and electrically i-type (intrinsic) semiconductor layer.

The first heat treatment may be performed on the oxide semiconductor film that has not yet been processed into the island-shaped semiconductor layer 859. In that case, the substrate is taken out from the heat apparatus after the first heat treatment, and then a photolithography step is performed.

Note that the first heat treatment may be performed at any of the following timings in addition to the above timing as long as it is performed after deposition of the oxide semiconductor layer: after a source electrode layer and a drain electrode layer are formed over the oxide semiconductor layer and after an insulating layer is formed over the source electrode layer and the drain electrode layer.

Further, the step of forming the contact hole in the insulating layer 827 by a third photolithography step may be performed either before or after the first heat treatment is performed.

In addition, as the oxide semiconductor film, an oxide semiconductor film having a crystal region with a large thickness (a single crystal region), that is, a crystal region which is c-axis-aligned perpendicularly to a surface of the film may be formed by performing deposition twice and heat treatment twice, even when any of an oxide, a nitride, a metal, or the like is used for a material of a base component. For example, a first oxide semiconductor film with a thickness of greater than or equal to 3 nm and less than or equal to 15 nm is deposited, and the first heat treatment is performed in a nitrogen, an oxygen, a rare gas, or a dry air atmosphere at a temperature higher than or equal to 450° C. and lower than or equal to 850° C. or preferably higher than or equal to 550° C. and lower than or equal to 750° C., so that a first oxide semiconductor film having a crystal region (including a plate-like crystal) in a region including a surface is formed. Then, a second oxide semiconductor film which has a larger thickness than the first oxide semiconductor film is formed, and a second heat treatment is performed at higher than or equal to 450° C. and lower than or equal to 850° C. or preferably higher than or equal to 600° C. and lower than or equal to 700° C., so that crystal growth proceeds upward with the use of the first oxide semiconductor film as a seed of the crystal growth and the whole second oxide semiconductor film is crystallized. In such a manner, the oxide semiconductor film having a crystal region having a large thickness may be formed.

Next, a conductive layer is formed over the insulating layer 827 and the semiconductor layer 859 and selectively etched by a fourth photolithography step, so that the source electrode 856 and the drain electrode 857 are formed. Note that a resist mask may be formed by an inkjet method. Formation of the resist mask by an inkjet method needs no photomask; thus, manufacturing cost can be reduced.

The conductive layer can be formed using the material similar to that of the gate electrode 858 and the capacitor wiring 853. The thickness of the source electrode 856 and the drain electrode 857 is preferably greater than or equal to 100 nm and less than or equal to 10000 nm. The end portions of the source electrode 856 and the drain electrode 857 are tapered, whereby coverage with the insulating layer 828 formed later can be improved and disconnection can be prevented. In this embodiment, as a conductive layer, a three-layer stacked film in which a 400-nm-thick aluminum layer is stacked over a 100-nm-thick titanium layer and a 100-nm-thick titanium layer is stacked over the aluminum layer is used (see FIG. 5A).

The etching of the conductive layer may be performed by either a dry etching method or a wet etching method. For dry etching, an excitation method such as an inductively coupled plasma (ICP) etching method using a gas containing chlorine or fluorine as an etching gas can be used.

Note that it is preferable that etching conditions be optimized so as not to etch and divide the semiconductor layer when the conductive layer is etched. However, it is difficult to obtain etching conditions in which only the conductive layer is etched and the semiconductor layer is not etched at all. In some cases, depending on the etching conditions, only part of the semiconductor layer is etched to be a semiconductor layer having a groove portion (a recessed portion) when the conductive layer is etched.

In addition, the conductive layer to be the source electrode 856 and the drain electrode 857 (including a wiring layer formed from the same layer as the source electrode and the drain electrode) may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO) or any of these metal oxide materials in which silicon oxide is contained can be used.

Next, the insulating layer 828 is formed over the semiconductor layer 859, the source electrode 856, and the drain electrode 857. Before the insulating layer 828 is formed, heat treatment may be performed at 300° C. in a nitrogen atmosphere for one hour. Further, before the insulating layer 828 is formed, plasma treatment using a gas such as dinitrogen monoxide ($N_2O$), nitrogen ($N_2$), or argon (Ar) may be performed to remove water and the like attached to an exposed surface of the oxide semiconductor layer. When the plasma treatment is performed, the insulating layer 828 is formed without exposure to the air.

The insulating layer 828 can be formed to a thickness at least 1 nm by a method by which an impurity such as water or hydrogen does not enter the insulating layer 828, such as a sputtering method as appropriate. When hydrogen is contained in the insulating layer 828, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a film formation method in which hydrogen is not used be employed in order to form the insulating layer 828 containing as little hydrogen as possible.

In this embodiment, a silicon oxide layer is formed to a thickness of 300 nm as the insulating layer 828 by a sputtering method (see FIG. 5B). The silicon oxide layer can be deposited by a sputtering method in a rare gas (typically, argon) atmosphere, an oxygen atmosphere, or a mixed atmosphere containing a rare gas and oxygen. As a target, a silicon oxide target or a silicon target can be used. For example, the silicon oxide layer can be formed using a silicon target by a sputtering method in an atmosphere containing oxygen. As the insulating layer 828 that is formed in contact with the oxide semiconductor layer, an inorganic insulating layer that does not contain impurities such as moisture, a hydrogen ion, and $OH^-$ and blocks entry of these from the outside is used. Typically, a silicon oxide layer, a silicon oxynitride layer, an aluminum oxide layer, an aluminum oxynitride layer, or the like is used.

Note that a protective insulating layer may be additionally formed over the insulating layer 828. For example, a silicon nitride layer is formed by an RF sputtering method. Since an RF sputtering method has high productivity, it is preferably used as a film formation method of the protective insulating layer. As the protective insulating layer, an inorganic insulating layer that does not include an impurity such as moisture and prevents entry of these from the outside, such as a silicon nitride layer or an aluminum nitride layer may be used.

Next, a second heat treatment is performed, preferably in an inert gas atmosphere or oxygen gas atmosphere (preferably at a temperature higher than or equal to 200° C. and lower than or equal to 400° C., for example, higher than or equal to 250° C. and lower than or equal to 350° C.). For example, the second heat treatment is performed in a nitrogen atmosphere at 250° C. for one hour. In the second heat treatment, part of the oxide semiconductor layer (a channel formation region) is heated while being in contact with the insulating layer 828.

Through the above process, the first heat treatment is performed on the oxide semiconductor film so that an impurity such as hydrogen, moisture, a hydroxyl group, or hydride (also referred to as a hydrogen compound) is removed from the oxide semiconductor layer, and oxygen which is one of main components of an oxide semiconductor and is reduced in the step of removing impurities can be supplied by the second heat treatment. Accordingly, the oxide semiconductor layer is highly purified to be an electrically i-type (intrinsic) semiconductor.

When a silicon oxide layer having a lot of defects is used as the insulating layer 828, by the heat treatment performed after the formation of the silicon oxide layer, impurities such as hydrogen, moisture, hydroxyl, or hydride contained in the oxide semiconductor layer can be diffused to the insulating layer 828 so that impurities in the oxide semiconductor layer can be further reduced.

Note that in this embodiment, the second heat treatment is performed after the insulating layer 828 is formed; however, the timing of the second heat treatment is not limited thereto. For example, the second heat treatment may be performed after the source and drain electrodes are formed, or after the reflective electrode is formed.

Next, by a fifth photolithography step, part of the insulating layer 828 that overlaps with the drain electrode 857 is selectively removed, so that the contact hole 855 is formed (see FIG. 5C). Note that a resist mask may be formed by an inkjet method. Formation of the resist mask by an inkjet method needs no photomask; thus, manufacturing cost can be reduced. The etching of the insulating layer 828 here may be performed by either one or both of a dry etching method and a wet etching method.

Next, the etching-stop layer 829 is formed over the insulating layer 828. The etching-stop layer 829 has a function of protecting the insulating layer 828 from damage due to etching in the formation step of the structure 820 later.

As a material of the etching-stop layer 829, a conductive material, an insulating material, or a semiconductor material can be used as long as it is a light-transmitting material that can withstand an etching process in the formation process of the structure 820. As a material for the etching-stop layer 829, indium oxide ($In_2O_3$), tin oxide ($SnO_2$), zinc oxide (ZnO), an indium oxide-tin oxide alloy ($In_2O_3$—$SnO_2$, which is abbreviated to ITO), an indium oxide-zinc oxide alloy ($In_2O_3$—ZnO), an aluminum oxide, or an aluminum oxynitride, or the like can be used. The above-described oxide semiconductors such as an In—Ga—Zn—O-based oxide semiconductor can be used.

The thickness of the etching-stop layer 829 can be determined in accordance with the height of the structure 820, and the selectivity in the etching condition when the structure 820 is formed. The thickness of the etching-stop layer 829 is preferably greater than or equal to 10 nm and less than or equal to 100 nm. In this embodiment, a 50-nm-thick In—Ga—Zn—O-based oxide semiconductor is used for the etching-stop layer 829 (see FIG. 6A).

Next, an insulating layer 833 to form the structure 820 is formed over the etching-stop layer 829. As a material for the insulating layer 833, a light-transmitting material such as silicon oxide ($SiO_x$), silicon nitride ($SiN_x$), silicon oxynitride (SiNO), an acrylic resin, a polyimide resin, a siloxane resin, phosphosilicate glass (PSG), or borophosphosilicate glass (BPSG) can be used.

The height of the structure 820 is determined by the thickness of the insulating layer 833. The thickness of the insulating layer 833 is greater than or equal to 1 µm, preferably greater than or equal to 3 µm, further preferably greater than or equal to 5 µm. As the structure 820 is higher, the difference between the area of the backlight entrance 842 and the area of the backlight exit 841 becomes larger; therefore, the amount of transmitted light from the opening 826 can be increased without increasing the luminance of the backlight. In this embodiment, a 4-µm-thick polyimide resin is formed as an insulating layer to form the structure 820 (see FIG. 6B).

Figure 6A:
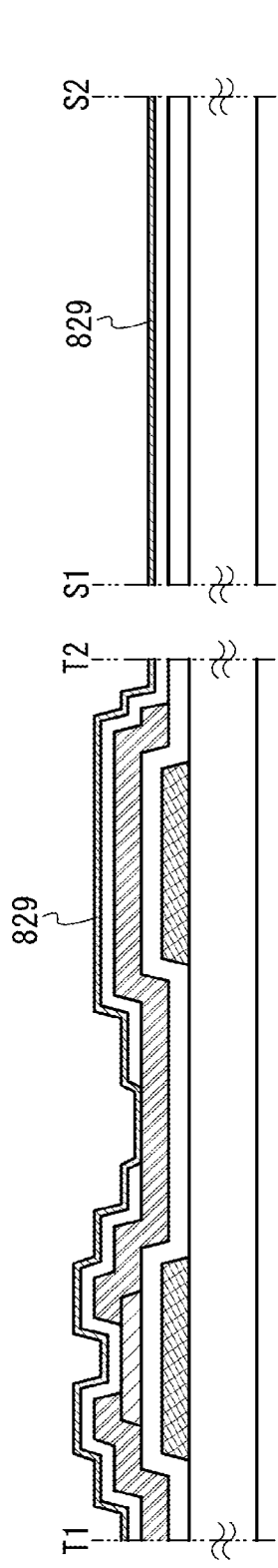
FIGS. 6A and 6B are cross-sectional views illustrating the manufacturing process of the semiconductor device.
Figure 6B:
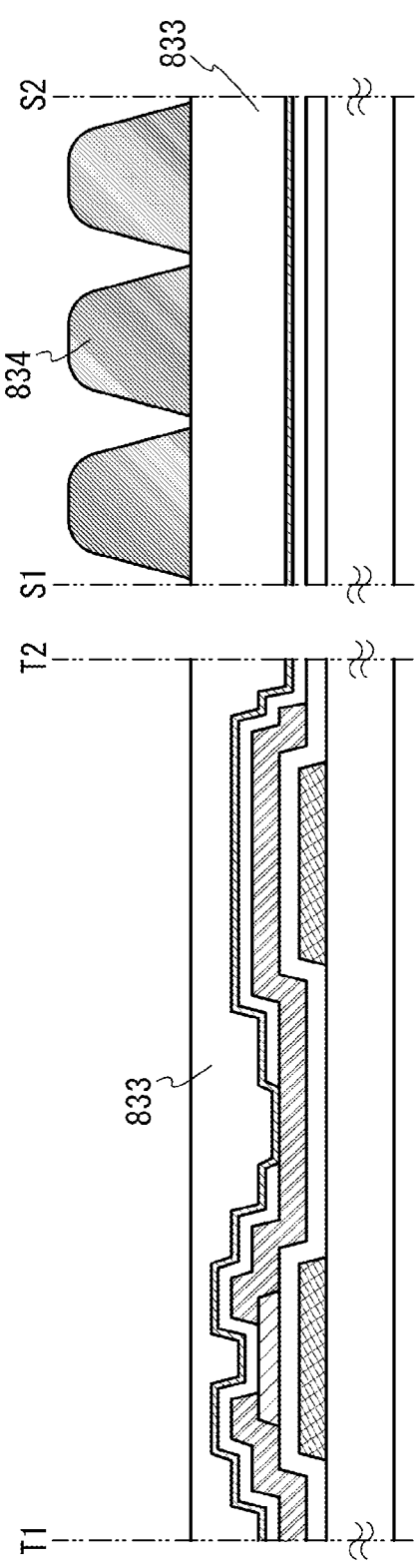

Next, by a sixth photolithography step, a resist mask 834 having a tapered shape is formed using a photomask over the insulating layer 833 (see FIG. 6B). Note that the tapered resist mask can be formed by a known method.

Then, the insulating layer 833 is selectively etched by dry etching, so that the structure 820 is formed. Dry etching is performed under the condition that the selectivity between the resist mask 834 and the insulating layer 833 is low, and the insulating layer 833 is etched while the resist mask 834 is etched (see FIG. 7A). Accordingly, the insulating layer 833 is etched while the resist mask 834 is downsized, so that the structure 820 that reflects the shape of the resist mask 834 can be formed. In this embodiment, although a mixed gas of carbon tetrafluoride ($CF_4$) and oxygen is used as an etching gas, there is no limitation as long as it is a gas that can be used under the condition that the selectivity between the resist mask 834 and the insulating layer 833 is low.

Note that the angle of the tapered shape, that is θT, of the structure 820 can be determined by a tapered shape of the resist mask 834 and the selectivity between the resist mask 834 and the insulating layer 833 in the etching.

Although the etching-stop layer 829 is exposed when unnecessary portions of the insulating layer 833 are removed, the etching-stop layer 829 is hardly etched by dry etching using a mixed gas of carbon tetrafluoride ($CF_4$) and oxygen because the etching-stop layer 829 used in this embodiment is an In—Ga—Zn—O-based oxide semiconductor.

When the etching-stop layer 829 is not formed, damage to the insulating layer 828 in the bottom layer is caused by the dry etching, which leads to a reduction in yield or variation in characteristics. In some cases, the insulating layer 828 is removed, which has a fatal impact on the semiconductor layer 859. In particular, the tendency is increased as the insulating layer 833 is thicker in order to heighten the structure 820. With the use of the etching-stop layer 829, productivity of a semiconductor device is increased, and a semiconductor device with high reproducibility of display and less variation in characteristics can be obtained.

Figure 7A:
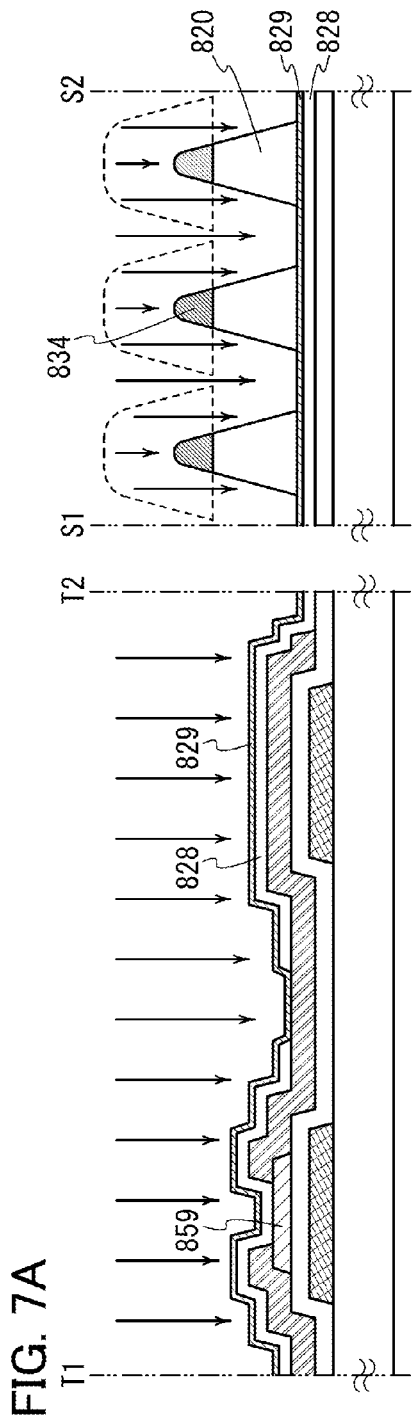
FIGS. 7A to 7C are cross-sectional views illustrating the manufacturing process of the semiconductor device.
Figure 7B:
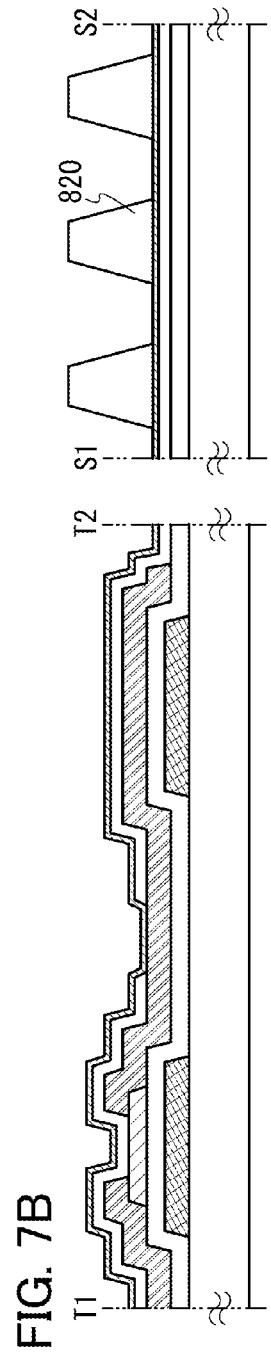
Figure 7C:
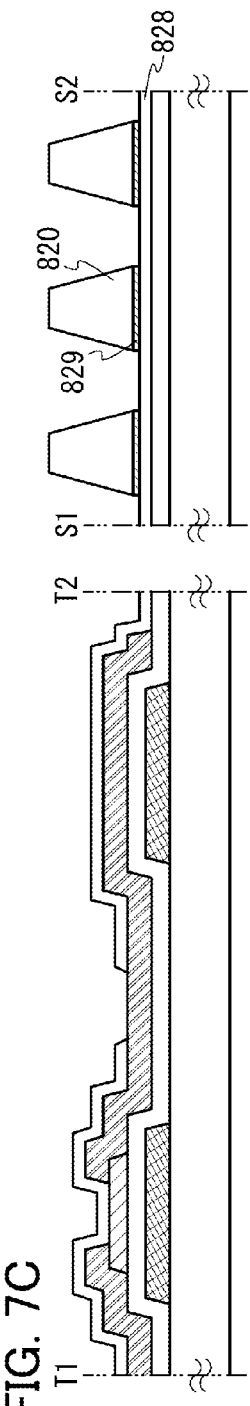

After the dry etching is performed, the resist mask 834 is removed, so that the structure 820 is completed (see FIG. 7B).

Next, the etching-stop layer 829 that is exposed and that is not under the structure 820 is removed by etching. The etching here may be performed by either dry etching or wet etching as long as the structure 820 and the insulating layer 828 are not influenced very much; however, wet etching is preferable because damage to the structure 820 and the insulating layer 828 is hardly caused. In this embodiment, the etching-stop layer 829 is etched using ITO-07N (produced by KANTO CHEMICAL CO., INC.) (see FIG. 7C). Note that the exposed etching-stop layer 829 is not necessarily removed unless other steps and structure are adversely affected.

Next, a metal layer is formed over the structure 820 and the insulating layer 828, so that the reflective layer 821 is formed by the seventh photolithography step. Note that a resist mask may be formed by an inkjet method. Formation of the resist mask by an inkjet method needs no photomask; thus, manufacturing cost can be reduced.

The metal layer can be formed using a material with high reflectance of visible light such as aluminum (Al) or silver (Ag), or an alloy including any of these. A metal material such as molybdenum, titanium, tantalum, or tungsten may be stacked over the material with high reflectance. In this embodiment, a reflective layer 821a and a reflective layer 821b are stacked as the reflective layer 821. The reflective layer 821a and the reflective layer 821b are formed using aluminum and titanium, respectively. With such a structure, generation of a hillock or a whisker in an aluminum layer can be prevented, a reduction in reflectance and an increase in electric resistance due to migration can be prevented.

The etching of the metal layer may be performed by either a dry etching method or a wet etching method. For dry etching, an excitation method such as an inductively coupled plasma (ICP) etching method using a gas containing chlorine or fluorine as an etching gas can be used.

In addition, part of the reflective layer 821 can be used as a wiring. In this embodiment, the structure in which the reflective layer 821 and the drain electrode 857 is connected through the contact hole 855 is shown (see FIG. 8A).

Next, part of the reflective layer 821 that is contact with the backlight exit 841 of the structure 820 is removed. First, the resist mask 835 is formed over the reflective layer 821 (see FIG. 8B).

After that, the resist mask 835 is etched by dry etching until the reflective layer 821 over the backlight exit 841 of the structure 820 is exposed (see FIG. 8C). As the etching gas here, oxygen or a gas containing oxygen may be used.

Next, the exposed portion of the reflective layer 821 are removed by etching (see FIG. 9A). Either dry etching or wet etching may be employed for etching; however, dry etching is preferable because etching rate can be easily controlled. For dry etching, an excitation method such as an inductively coupled plasma (ICP) etching method using a gas containing chlorine or fluorine as an etching gas can be used.

After that, the remaining resist mask 835 is removed, so that the structure in which the reflective layer 821 is in contact with the side surfaces (surfaces other than the backlight exit 841 and the backlight entrance 842) of the structure 820 can be provided (see FIG. 9B).

Next, the transparent electrode 823 is formed over the structure 820 by an eighth photolithography step. As the transparent electrode 823, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials in which silicon oxide is contained can be used (see FIG. 9C).

In this embodiment, since the transparent electrode 823 is formed using the photo mask that is used in the seventh photolithography step, the transparent electrode 823 is stacked over the reflective layer 821 and is connected to the drain electrode 857 through the reflective layer 821. Note that when different masks are used between the seventh photolithography step and the eighth photolithography step, a structure may be provided in which the reflective layer 821 is not formed in the contact hole 855, so that the transparent electrode 823 and the drain electrode 857 are directly connected to each other.

Next, the organic resin layer 822 having an uneven curving top surface is formed over the transparent electrode 823. For the organic resin layer 822, a photosensitive organic resin such as acrylic, polyimide, benzocyclobutene, phenol, or polystyrene may be used. The organic resin layer 822 is partly exposed to light by a ninth photolithography with the use of the photosensitive organic resin, so that the organic resin layer 822 can have an uneven curving top surface without using a resist mask (see FIG. 10A).

The shape and depth of the uneven curving surface can be adjusted arbitrarily by adjusting intensity and time of the light exposure, and the like. By forming the photo mask by a method of forming a gray-tone mask, the uneven curving surface can be formed over the organic resin layer 822 and the contact hole 865 can be formed in the organic resin layer 822 at the same time without changing intensity and time of the light exposure (see FIG. 1C).

Next, a conductive layer is formed over the organic resin layer 822, so that the reflective electrode 825 having the opening 826 is formed by a tenth photolithography step. Note that a resist mask may be formed by an inkjet method. Formation of the resist mask by an inkjet method needs no photomask; thus, manufacturing cost can be reduced.

The conductive layer can be formed using a material with high reflectance of visible light such as aluminum (Al) or silver (Ag), or an alloy including any of these. A metal material such as molybdenum, titanium, tantalum, or tungsten may be provided between the conductive layer and the organic resin layer 822. In this embodiment, a reflective electrode 825*a* and a reflective electrode 825*b* are stacked as the reflective electrode 825. The reflective electrode 825*a* and the reflective electrode 825*b* are formed using aluminum and titanium, respectively (see FIG. 10B). With such a structure, generation of a hillock or a whisker in an aluminum layer can be prevented, a reduction in reflectance and an increase in electric resistance due to migration can be prevented.

The etching of the conductive layer may be performed by either a dry etching method or a wet etching method. For dry etching, an excitation method such as an inductively coupled plasma (ICP) etching method using a gas containing chlorine or fluorine as an etching gas can be used.

In this embodiment, the conductive layer is etched by a dry etching method, so that the reflective electrode 825 having the opening 826 is formed. In addition, the organic resin layer 822 in the opening 826 is also etched in the etching of the conductive layer, so that the transparent electrode 823 is exposed.

By reflecting the curving surface with an uneven shape of the organic resin layer 822 on the reflective electrode 825, the area of the reflective region can be increased, and reflection of an object from outside is reduced so that visibility of the displayed image can be improved.

Through the above steps, the semiconductor device disclosed in this embodiment can be fabricated.

In a transistor including an oxide semiconductor layer, the current value in an off state (the off-state current value) can be small. Therefore, an electric signal such as image data can be held for a longer period and a writing interval can be set longer. Consequently, frequency of refresh operation can be reduced, which leads to an effect of suppressing power consumption.

In a transistor including an oxide semiconductor, relatively high field-effect mobility can be obtained, whereby high-speed operation is possible. Accordingly, by using the transistor in a pixel portion of a liquid crystal display device, a high-quality image can be provided. Since the transistors can be separately formed over one substrate in a circuit portion and a pixel portion, the number of components can be reduced in the liquid crystal display device.

By using this embodiment, a semi-transmissive liquid crystal display device with bright and high-quality display can be obtained without increasing power consumption.

Embodiment 2

In this embodiment, an example of a transistor that can be applied to a liquid crystal display device disclosed in this specification is described. There is no particular limitation on the structure of the transistor; for example, a staggered type transistor or a planar type transistor having a top-gate structure or a bottom-gate structure can be employed. Further, the transistor may have a single gate structure including one channel formation region, a double gate structure including two channel formation regions, or a triple gate structure including three channel formation regions. Alternatively, the transistor may have a dual-gate structure including two gate electrodes positioned above and below a channel region with gate insulating layers provided therebetween. Note that examples of cross-sectional structures of transistors illustrated FIGS. 11A to 11D are described below. Transistors illustrated in FIGS. 11A to 11D are transistors each using an oxide semiconductor as a semiconductor. An advantage of using an oxide semiconductor is that high mobility and low off-state current can be obtained in a relatively easy and low-temperature process; however, it is needless to say that another semiconductor may be used.

The composition material of the transistor disclosed in Embodiment 1 can be used as that of the transistors disclosed in this embodiment.

Figure 11A:
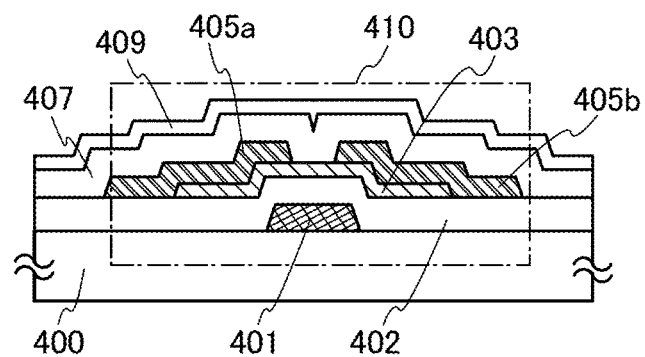
FIGS. 11A to 11D are diagrams each illustrating one mode of a transistor that can be applied to a semiconductor device.

A transistor 410 illustrated in FIG. 11A is one of bottom-gate transistors, and is also one of inverted staggered transistors.

The transistor 410 includes, over a light-transmitting substrate 400, a gate electrode 401, a gate insulating layer 402, an oxide semiconductor layer 403, a source electrode 405*a*, and a drain electrode 405*b*. Further, an insulating layer 407 stacked over the oxide semiconductor layer 403 is provided so as to cover the transistor 410. A protective insulating layer 409 is formed over the insulating layer 407.

Figure 11B:
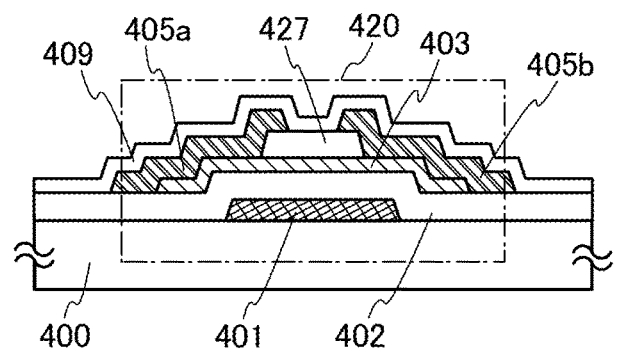

A transistor 420 illustrated in FIG. 11B is one of bottom-gate transistors called channel-protective (channel-stop) transistors and is also one of inverted staggered transistors.

The transistor 420 includes, over the light-transmitting substrate 400, the gate electrode 401, the gate insulating layer 402, the oxide semiconductor layer 403, an insulating layer 427 functioning as a channel protective layer which covers a channel formation region of the oxide semiconductor layer 403, the source electrode 405a, and the drain electrode 405b. Further, the protective insulating layer 409 is formed so as to cover the transistor 420.

Figure 11C:
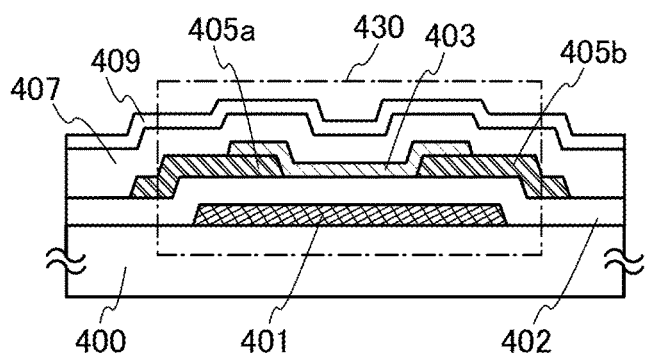

A transistor 430 illustrated in FIG. 11C is one of bottom-gate transistors. The transistor 430 includes, over the light-transmitting substrate 400, the gate electrode 401, the gate insulating layer 402, the source electrode 405a, the drain electrode 405b, and the oxide semiconductor layer 403. Further, the insulating layer 407 being in contact with the oxide semiconductor layer 403 is provided so as to cover the transistor 430. A protective insulating layer 409 is formed over the insulating layer 407.

In the transistor 430, the gate insulating layer 402 is provided on and in contact with the substrate 400 and the gate electrode 401, and the source electrode 405a and the drain electrode 405b are provided on and in contact with the gate insulating layer 402. Further, the oxide semiconductor layer 403 is provided over the gate insulating layer 402, the source electrode 405a, and the drain electrode 405b.

Figure 11D:
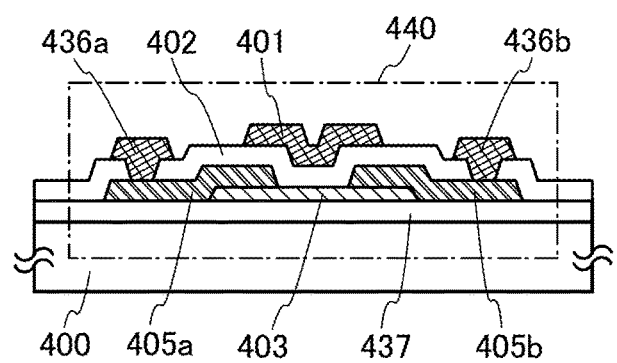

A transistor 440 illustrated in FIG. 11D is one of top-gate transistors. The transistor 440 includes, over the light-transmitting substrate 400, an insulating layer 437, the oxide semiconductor layer 403, the source electrode 405a, the drain electrode 405b, the gate insulating layer 402, and the gate electrode 401. A wiring layer 436a a wiring layer 436b are provided to be in contact with and electrically connected to the source electrode 405a and the drain electrode 405b, respectively.

In the transistors 410, 420, 430, and 440 each including the oxide semiconductor layer 403, the current value in an off state (an off-state current value) can be reduced. Therefore, electric signal of image data and the like can be held for a longer period, so that a writing interval can be set long. Accordingly, frequency of refresh operation can be reduced, which leads to an effect of suppressing power consumption.

Further, in the transistors 410, 420, 430, and 440 each including the oxide semiconductor layer 403, relatively high field-effect mobility can be obtained, whereby high-speed operation is possible. Therefore, by using any of the transistors in a pixel portion of a liquid crystal display device, high-quality image can be provided. Since the transistors can be separately formed over one substrate in a circuit portion and a pixel portion, the number of components can be reduced in the liquid crystal display device.

Thus, a high-performance liquid crystal display device can be provided by using a transistor including an oxide semiconductor layer.

Embodiment 3

In this embodiment, a structural example of a semi-transmissive liquid crystal display module will be described. The semi-transmissive liquid crystal display module described in this embodiment displays images in mono-color display when used in a reflective mode, and displays in full-color display when used in a transparent mode.

Figure 12:
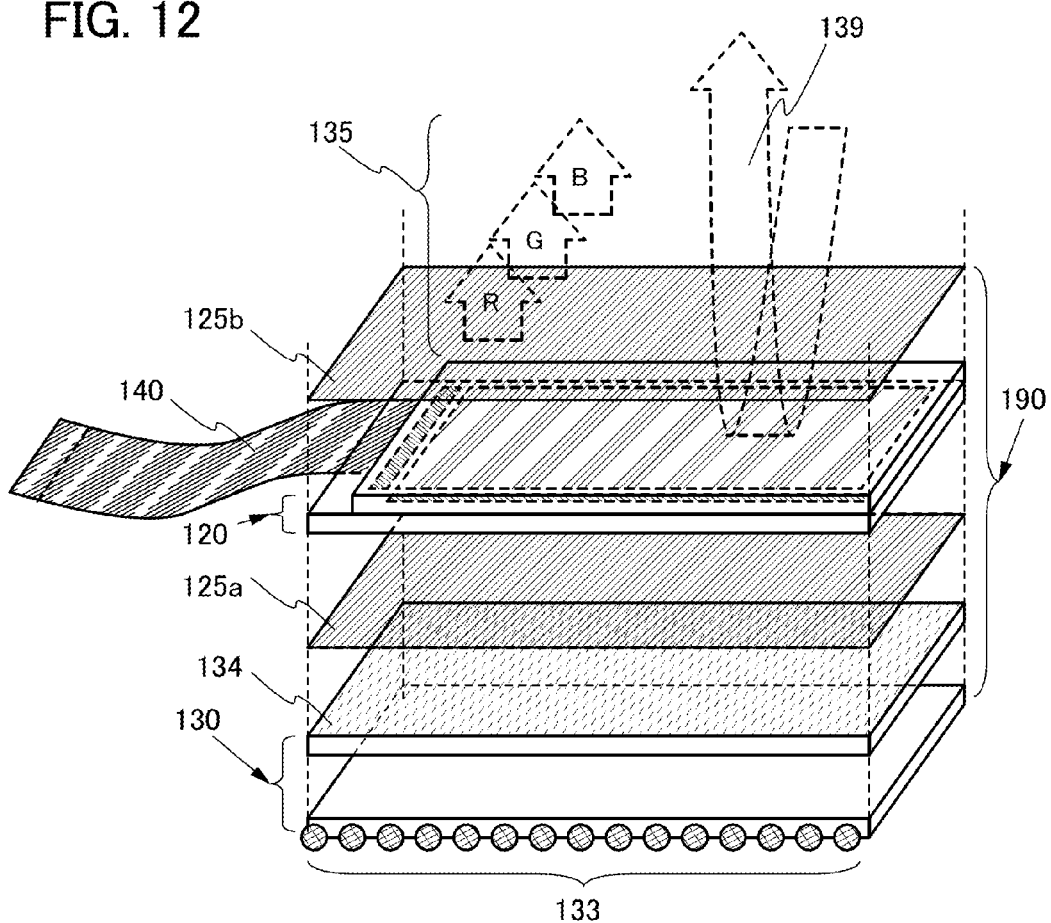
FIG. 12 is a perspective view of a liquid crystal module.

FIG. 12 illustrates a structure of a liquid crystal display module 190. The liquid crystal display module 190 includes the backlight portion 130, the display panel 120 in which liquid crystal elements are arranged in matrix, and a polarizing plate 125a and a polarizing plate 125b which are provided with the display panel 120 positioned therebetween. The backlight portion 130 is a surface-emitting backlight portion that emits uniform white light. For example, the backlight portion 130 may include a white LED 133 placed in an end portion of a light guide plate and a diffusing plate 134 provided between the light guide plate and the display panel 120. In addition, a flexible printed circuit (FPC) 140 serving as an external input terminal is electrically connected to a terminal portion provided in the display panel 120.

Note that each of the liquid crystal elements provided in the display panel 120 has a structure similar to that of the pixel described in Embodiment 1.

First, a method for displaying images in the reflective mode is described. In FIG. 12, an arrow is used to illustrate schematically how external light 139 is transmitted through the liquid crystal elements in the display panel 120 and reflected by a reflective electrode to the viewer side. The external light 139 is transmitted through a liquid crystal layer, reflected by the reflective electrode, and transmitted through the liquid crystal layer again to be extracted. The intensity of the light that is transmitted through the liquid crystal elements is modulated by an image signal. Therefore, a viewer can perceive an image by reflected light of the external light 139.

Next, a method for displaying images in the transmissive mode is described. In FIG. 12, arrows indicating light 135 of three colors (R, G, and B) are used to illustrate schematically how light from the backlight portion 130 enters a back surface of the display panel 120 and is transmitted to the viewer side through a structure (an anisotropic light-condensing means), a coloring layer, a transmissive electrode, and the liquid crystal elements provided in the display panel. For example, in a part of the pixel overlapping with a red coloring layer functioning as a color filter, light from the backlight is condensed to the red coloring layer by the structure (the anisotropic light-condensing means) provided in the display panel, and transmitted through the coloring layer, the transmissive electrode, and the liquid crystal elements to be extracted as red light. The intensity of the light transmitted through the liquid crystal elements is modulated by an image signal; therefore, a viewer can perceive an image by the light 135 of three colors. Note that since full-color display is employed, a circuit configuration is employed in which three display elements of a red display element, a green display element, and a blue display element are supplied with respective video signals different from each other.

This embodiment can be combined with any of the other embodiments in this specification as appropriate.

Embodiment 4

In this embodiment, one mode of a liquid crystal display device of the present invention and a driving method thereof in which low power consumption can be achieved will be described with reference to FIG. 13, FIG. 14, FIG. 15, FIG. 16, FIG. 17, FIGS. 18A and 18B, and FIG. 19.

Figure 13:
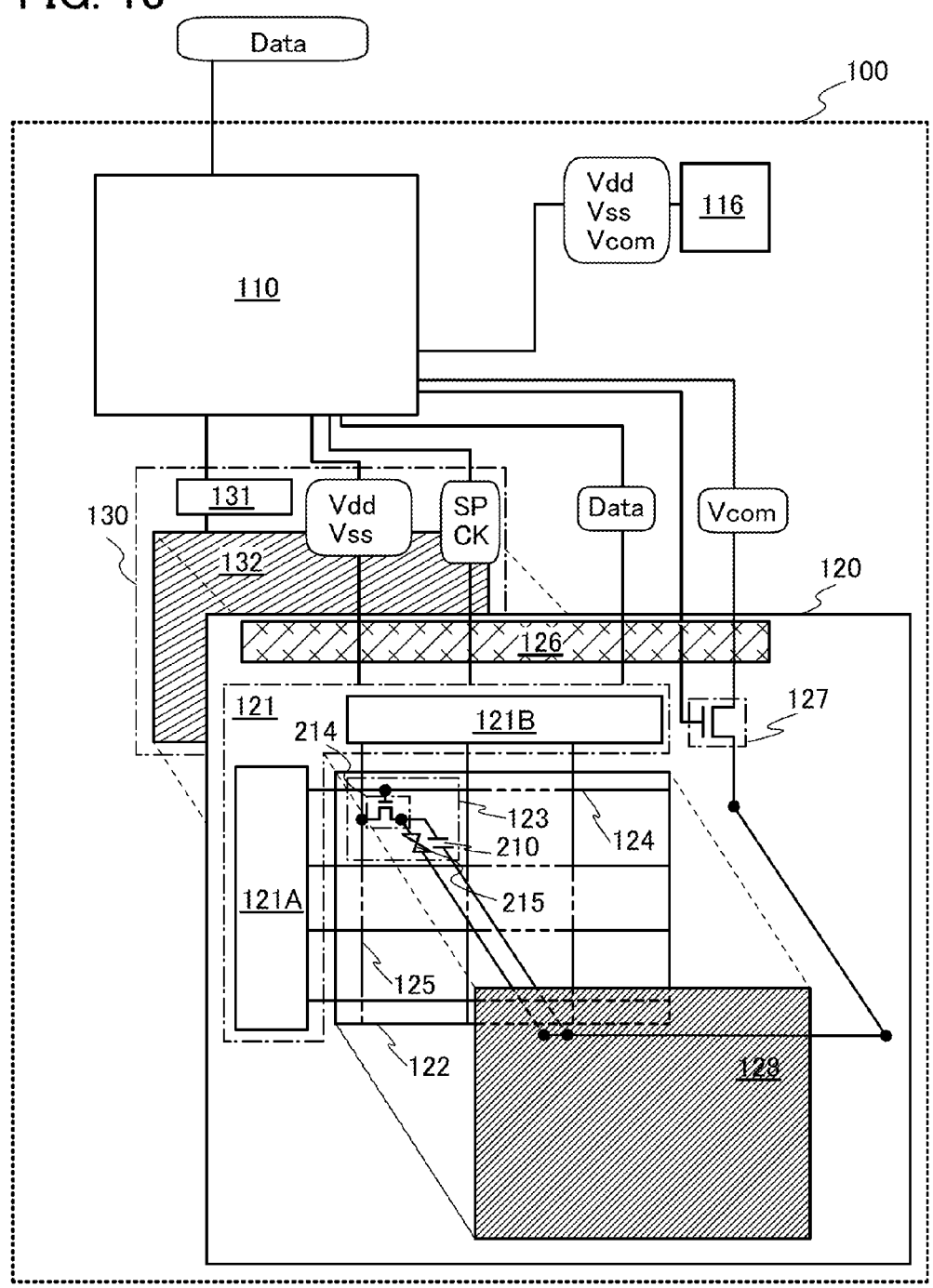
FIG. 13 is a block diagram illustrating a structure of a semiconductor device.

Components of a liquid crystal display device 100 described in this embodiment are illustrated in a block diagram of FIG. 13. The liquid crystal display device 100 includes an image processing circuit 110, a power supply 116, a display control circuit 113, and the display panel 120. In the case of a transmissive liquid crystal display device or a semi-transmissive liquid crystal display device, the backlight portion 130 is further provided as a light source.

To the liquid crystal display device 100, an image signal (an image signal Data) is supplied from an external device connected to the liquid crystal display device. Note that power supply potential (high power supply potential Vdd, low power supply potential Vss, and common potential Vcom) is supplied by turning on the power supply 116 of the liquid crystal display device and starting supplying power, and control signals (a start pulse SP and a clock signal CK) are supplied by the display control circuit 113.

Note that the high power supply potential Vdd is a potential higher than a reference potential, and the low power supply potential Vss is a potential lower than or equal to the reference potential. Note that it is desirable that each of the high power supply potential Vdd and the low power supply potential Vss be a potential such that a transistor can operate. The high power supply potential Vdd and the low power supply potential Vss are collectively referred to as a power supply voltage or a power supply potential in some cases.

The common potential Vcom may be any potential as long as it serves as reference with respect to the potential of an image signal supplied to a pixel electrode. For example, the common potential Vcom may be a ground potential.

Note that the image signal Data may be appropriately inverted in accordance with dot inversion driving, source line inversion driving, gate line inversion driving, frame inversion driving, or the like to be input to the liquid crystal display device 100. When the image signal is an analog signal, it may be converted to a digital signal through an A/D converter or the like to be supplied to the liquid crystal display device 100.

In this embodiment, the common potential Vcom that is a fixed potential is supplied from the power supply 116 to a common electrode 128 and one electrode of a capacitor 210 through the display control circuit 113.

The display control circuit 113 is a circuit which supplies a display panel image signal (Data), a control signal (specifically, a signal for controlling switching between supply and stop of the control signal such as the start pulse SP and the clock signal CK), and the power supply potential (the high power supply potential Vdd, the low power supply potential Vss, and the common potential Vcom) to the display panel 120.

The image processing circuit 110 analyzes, calculates, and processes an input image signal (image signal Data), and then outputs the processed image signal together with a control signal to the display control circuit 113.

Specifically, the image processing circuit 110 analyzes the input image signal Data, determines whether the input image signal Data is for a moving image or a still image, and outputs a control signal including the determination result to the display control circuit 113. Further, the image processing circuit 110 captures a still image of one frame from the image signal Data including a moving image or a still image and outputs the captured image together with a control signal which indicates that the captured image is a still image to the display control circuit 113. The image processing circuit 110 outputs the input image signal Data together with the above control signal to the display control circuit 113. Note that the above-described function is an example of functions that the image processing circuit 110 has, and a variety of image processing functions may be selected and applied in accordance with applications of the display device.

Note that since an image signal which is converted to a digital signal is easily calculated (e.g., detection of a difference between image signals), when an input image signal (image signal Data) is an analog signal, an A/D converter or the like is provided in the image processing circuit 110.

The display panel 120 has a structure in which a liquid crystal element 215 is provided between a pair of substrates (a first substrate and a second substrate). Specifically, the transparent electrode transmitting visible light, a reflecting electrode reflecting visible light, and the structure 820 (the anisotropic light-condensing means having a condensing direction X and a non-condensing direction Y) overlapping with the transparent electrode which are described in Embodiment 1 are provided on the same surface side of the first substrate. The first substrate is provided with a driver circuit portion 121 and a pixel portion 122. The second substrate is provided with a common connection portion (also referred to as a common contact) and the common electrode 128 (also referred to as a counter electrode). The common connection portion electrically connects the first substrate and the second substrate. The common connection portion may be provided over the first substrate.

In the pixel portion 122, a plurality of gate lines (scan lines) 124 and a plurality of source lines (signal lines) 125 are provided. A plurality of pixels 123 is provided in matrix so as to be surrounded by the gate lines 124 and the source lines 125. In the display panel described in this embodiment, the gate line 124 and the source line 125 are extended from a gate line side driver circuit 121A and a source line side driver circuit 121B, respectively.

In addition, the pixel 123 includes a transistor 214 as a switching element, and the capacitor 210 and the liquid crystal element 215 which are connected to the transistor 214.

The liquid crystal element 215 is an element that controls transmission and non-transmission of light by an optical modulation action of liquid crystal. The optical modulation action of liquid crystal is controlled by an electric field applied to the liquid crystal. The direction of the electric field applied to the liquid crystal varies according to a liquid crystal material, a driving method, and an electrode structure and can be selected as appropriate. For example, when a driving method in which an electric field is applied in a thickness direction (a so-called vertical direction) of liquid crystal is used, the pixel electrode and the common electrode may be provided over the first substrate and the second substrate, respectively, so as to sandwich the liquid crystal. When a driving method in which an electric field is applied in an in-plane direction of a substrate (a so-called horizontal direction) to liquid crystal is used, the pixel electrode and the common electrode may be provided over the same substrate with respect to the liquid crystal. The pixel electrode and the common electrode may have a variety of opening patterns. In this embodiment, there is no particular limitation on a liquid crystal material, a driving method, and an electrode structure as long as an element controls transmission and non-transmission of light by the optical modulation action.

In the transistor 214, one of the plurality of gate lines 124 provided in the pixel portion 122 is connected to the gate electrode, one of a source electrode and a drain electrode is connected to one of the plurality of source lines 125, and the other of the source electrode and the drain electrode is connected to one of the electrodes of the capacitor 210 and one of the electrodes of the liquid crystal element 215 (pixel electrode).

With such a structure, the capacitor 210 can hold voltage applied to the liquid crystal element 215. The electrode of the capacitor 210 may be connected to a capacitor line additionally provided.

As the transistor 214, a transistor whose off-state current is reduced is preferably used. When the off-state current is reduced, the transistor 214 in an off-state can stably hold charge in the liquid crystal element 215 and the capacitor 210. Further, when the transistor 214 whose off-state current is sufficiently reduced is used, the pixel 123 can be formed without providing the capacitor 210.

The driver circuit portion 121 includes the gate line side driver circuit 121A and the source line side driver circuit 121B. The gate line side driver circuit 121A and the source line side driver circuit 121B are driver circuits for driving the pixel portion 122 that includes a plurality of pixels and each include a shift register circuit (also referred to as a shift register).

Note that the gate line side driver circuit 121A and the source line side driver circuit 121B may be formed over the same substrate as the pixel portion 122 or over another substrate.

Note that the high power supply potential Vdd, the low power supply potential Vss, the start pulse SP, the clock signal CK, and the image signal Data which are controlled by the display control circuit 113 are supplied to the driver circuit portion 121.

A terminal portion 126 is an input terminal which supplies a predetermined signal output from the display control circuit 113 (such as the high power supply potential Vdd, the low power supply potential Vss, the start pulse SP, the clock signal CK, the image signal Data, and the common potential Vcom) and the like, to the driver circuit portion 121.

The common electrode 128 is electrically connected to a common potential line for supplying the common potential Vcom that is controlled by the display control circuit 113, in the common connection portion.

As a specific example of the common connection portion, the common electrode 128 and the common potential line can be electrically connected with a conductive particle in which an insulating sphere is covered with a thin metal film provided therebetween. Note that two or more common connection portions may be provided in the display panel 120.

The liquid crystal display device may include a photometric circuit. The liquid crystal display device provided with the photometric circuit can detect the brightness of the environment where the liquid crystal display device is put. Thus, the display control circuit 113 connected to the photometric circuit can control a driving method of a light source such as a backlight and a sidelight in accordance with a signal input from the photometric circuit.

The backlight portion 130 includes a backlight control circuit 131 and a backlight 132. The backlight 132 may be selected and combined in accordance with applications of the liquid crystal display device 100, and a light-emitting diode (LED) or the like can be used. For example, a white light-emitting element (e.g., LED) can be provided in the backlight 132. A backlight signal for controlling the backlight and the power supply potential are supplied from the display control circuit 113 to the backlight control circuit 131.

Note that an optical film (such as a polarizing film, a retardation film, or an anti-reflection film) can also be used in combination. A light source such as a backlight that is used in a semi-transmissive liquid crystal display device may be selected and combined in accordance with the use of the liquid crystal display device 100, and a cold cathode tube, a light-emitting diode (LED), or the like can be used. Further, a surface light source may be formed using a plurality of LED light sources, a plurality of electroluminescent (EL) light sources, or the like. As the surface light source, three or more kinds of LEDs may be used and an LED emitting white light may be used. Note that the color filter is not always provided when light-emitting diodes of RGB or the like are arranged in a backlight and a successive additive color mixing method (a field sequential method) in which color display is performed by time division is employed.

Next, a detail and a driving method of the liquid crystal display device illustrated in FIG. 13 will be described with reference to FIG. 14, FIG. 15, FIG. 16, FIG. 17, FIGS. 18A and 18B, and FIG. 19. The driving method of the liquid crystal display device described in this embodiment is a display method in which the frequency of rewriting in the display panel varies in accordance with properties of an image to be displayed. Specifically, when image signals in successive frames are different from each other (i.e., a moving image is displayed), a display mode in which an image signal is written to every frame is employed. On the other hand, when image signals in successive frames are the same (i.e., a still image is displayed), the following display mode is employed: image signals are prevented from being written or the writing frequency is extremely reduced in a period during which the same image is being displayed; the voltage applied to the liquid crystal element is held by setting potentials of the pixel electrode and the common electrode for applying a voltage to the display element in a floating state; and accordingly a still image is displayed without an additional supply of potential.

The liquid crystal display device displays a moving image and a still image in combination on its screen. By switching of a plurality of different images which is time-divided into a plurality of frames at high speed, the images are recognized as a moving image by human eyes. Specifically, by switching of images at least 60 times (60 frames) per second, the images are recognized as a moving image with less flicker by human eyes. In contrast, unlike a moving image and a partial moving image, a still image is an image which does not change in successive frame periods, for example, in an n-th frame and an (n+1)th frame, even when a plurality of images which are time-divided into a plurality of frame periods are switched at high speed.

The liquid crystal display device according to the present invention can be operated in different display modes, a moving-image display mode and a still-image display mode, in the case of displaying a moving image and displaying a still image, respectively. In this specification, an image displayed in the case of displaying a still image is also referred to as a still image.

Next, components of the liquid crystal display device 100 of this embodiment are described with reference to a block diagram of FIG. 14. The liquid crystal display device 100 is an example of a semi-transmissive liquid crystal display device in which a liquid crystal layer controls transmission and non-transmission of light in a pixel so that display is performed, and includes the image processing circuit 110, the power supply 116, the display panel 120, and the backlight portion 130.

To the liquid crystal display device 100, an image signal (an image signal Data) is supplied from an external device connected to the liquid crystal display device. Note that power supply potential (high power supply potential Vdd, low power supply potential Vss, and common potential Vcom) is supplied by turning on the power supply 116 of the liquid crystal display device and starting supplying power, and control signals (a start pulse SP and a clock signal CK) are supplied by the display control circuit 113. The high power supply potential Vdd is supplied to a Vdd line (not shown) included in the driver circuit portion 121, and the low power supply potential Vss is supplied to a Vss line (not shown) included in the driver circuit portion 121.

Next, a structure of the image processing circuit 110 and a procedure in which the image processing circuit 110 processes signals are described with reference to FIG. 14 as an example. Note that the image processing circuit 110 illustrated in FIG. 14 is just one mode of this embodiment and this embodiment is not limited to this structure.

Figure 14:
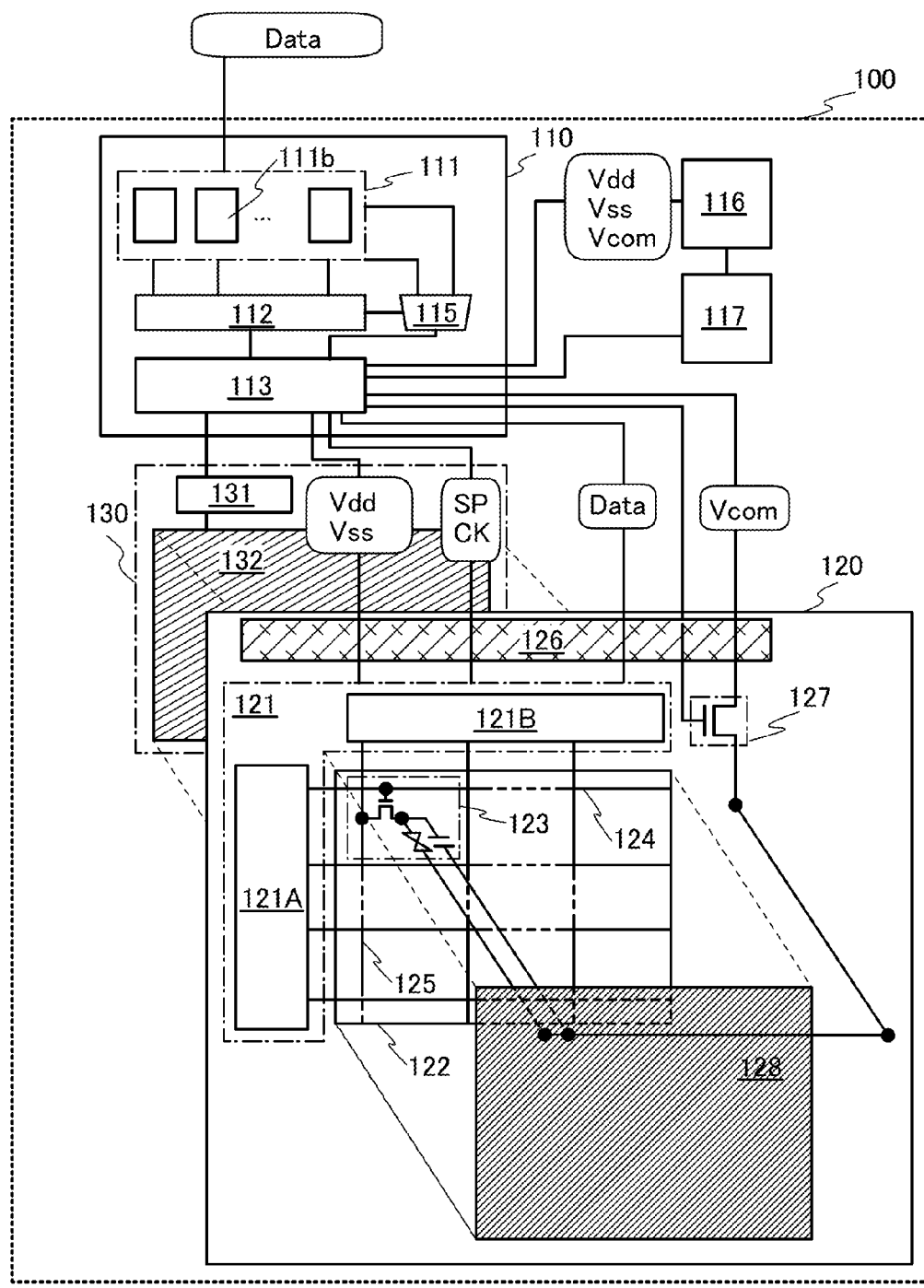
FIG. 14 is a block diagram illustrating a structure of a semiconductor device.

The image processing circuit 110 illustrated in FIG. 14 analyzes image signals which are successively input and determines whether the input image signal is for a moving image or a still image. When the input of image signals (image signal Data) is switched from an input of a moving image signal to an input of a still image signal, the image processing circuit 110 captures a still image and outputs the captured image together with a control signal which indicates that the captured image is a still image to the display control circuit 113. When the input of image signals (image signal Data) is switched from an input of a still image signal to an input of a moving image signal, the image processing circuit 110 outputs an image signal including a moving image together with a control signal which indicates that the image signal is a moving image to the display control circuit 113.

The image processing circuit 110 includes a memory circuit 111, a comparison circuit 112, the display control circuit 113, and a selection circuit 115. The image processing circuit 110 generates a display panel image signal and a backlight signal from the digital image signal Data that is input. The display panel image signal is an image signal that controls the display panel 120. The backlight signal is a signal that controls the backlight portion 130. The image processing circuit 110 outputs a signal that controls the common electrode 128 to a switching element 127.

The memory circuit 111 includes a plurality of frame memories for storing image signals for a plurality of frames. The number of frame memories included in the memory circuit 111 is not particularly limited as long as the image signals for a plurality of frames can be stored. Note that the frame memory may be formed using a memory element such as dynamic random access memory (DRAM) or static random access memory (SRAM).

Note that the number of frame memories is not particularly limited as long as an image signal can be stored for each frame period. In addition, the image signals stored in the frame memories are selectively read out by the comparison circuit 112 and the display control circuit 113. A frame memory 111b in the diagram illustrates a memory region for one frame conceptually.

The comparison circuit 112 is a circuit that selectively reads out image signals in successive frame periods stored in the memory circuit 111, compares the image signals in the successive frame periods in each pixel, and detects a difference thereof.

In this embodiment, depending on whether a difference of image signals between frames is detected or not, operations in the display control circuit 113 and the selection circuit 115 are determined. When a difference is detected in any of the pixels between frames by the comparison circuit 112 (when there is a difference), the comparison circuit 112 determines that the image signal is not a signal for displaying a still image and that the successive frame periods during which a difference is detected is a period during which a moving image is to be displayed.

On the other hand, when a difference is not detected in any of the pixels by the comparison between image signals in the comparison circuit 112 (when there is no difference), the successive frame periods during which the difference is not detected is determined as a period during which a still image is to be displayed. In other words, by detection of the differences in the comparison circuit 112, it is determined whether the image signals in successive frame periods are image signals for displaying moving images or image signals for displaying still images.

Note that the criterion of determining that there is a difference by the comparison may be set such that the difference is recognized when the difference exceeds a certain value. The comparison circuit 112 may be set to determine detection of a difference by the absolute value of the difference.

Although, in this embodiment, the structure in which whether an image is a moving image or a still image is determined by detection of the difference between the image signals in successive frame periods by the comparison circuit 112 provided inside the liquid crystal display device 100 is described, a structure in which a signal indicating whether the image is a still image or a moving image is supplied from the outside may be used.

The selection circuit 115 employs a structure in which a plurality of switches formed of transistors are provided, for example. When the comparison circuit 112 detects a difference in successive frame periods, that is, the image is a moving image, the selection circuit 115 selects an image signal of the moving image from the frame memories in the memory circuit 111 and outputs the image signal to the display control circuit 113.

Note that when the comparison circuit 112 does not detect a difference in the successive frame periods, that is, the image is a still image, the selection circuit 115 does not output the image signal to the display control circuit 113 from the frame memories in the memory circuit 111. With the structure in which an image signal is not output to the display control circuit 113 from the frame memory, power consumption of the liquid crystal display device can be reduced.

Note that in the liquid crystal display device of this embodiment, a mode of operation performed when the comparison circuit 112 determines an image as a still image is described as a still-image display mode, and a mode of operation performed when the comparison circuit 112 determines an image as a moving image is described as a moving-image display mode.

The display control circuit 113 is a circuit which supplies an image signal selected by the selection circuit 115, a control signal (specifically, a signal for controlling switching between supply and stop of the control signal such as the start pulse SP and the clock signal CK), and the power supply potential (the high power supply potential Vdd, the low power supply potential Vss, and the common potential Vcom) to the display panel 120 and which supplies a backlight control signal (specifically, a signal for the backlight control circuit 131 to control on and off of the backlight) to the backlight portion 130.

Note that the image processing circuit described in this embodiment as an example may have a display-mode switching function. The display-mode switching function is a function of switching between a moving-image display mode and a still-image display mode in such a manner that a user of the liquid crystal display device selects an operation mode of the liquid crystal display device by hand or using an external connection device.

The selection circuit 115 can output the image signal to the display control circuit 113 in accordance with a signal input from a display-mode switching circuit.

For example, when a mode-switching signal is input to the selection circuit 115 from the display-mode switching circuit while operation is performed in a still-image display mode, even when the comparison circuit 112 does not detect the difference of the image signals in successive frame periods, the selection circuit 115 can be operated in a mode in which image signals which are input are sequentially output to the display control circuit 113, that is, in a moving-image display mode. When a mode-switching signal is input to the selection circuit 115 from the display-mode switching circuit while operation is performed in a moving-image display mode, even when the comparison circuit 112 detects the difference of the image signal in successive frame periods, the selection circuit 115 can be operated in a mode in which only an image signal of one selected frame is output, that is, in a still-image display mode. As a result, in the liquid crystal display device of this embodiment, one frame among moving images is displayed as a still image.

Further, when the liquid crystal display device includes a photometric circuit, when the photometric circuit detects brightness and finds that the liquid crystal display device is used in a dim environment, the display control circuit 113 controls light of the backlight 132 to have higher intensity, so that favorable visibility of a display screen is secured. In contrast, when it is found that the liquid crystal display device is used under extremely bright external light (e.g., under direct sunlight outdoors), the display control circuit 113 controls light of the backlight 132 to have lower intensity, so that power consumed by the backlight 132 is reduced.

In this embodiment, the display panel 120 includes the switching element 127 besides the pixel portion 122. In this embodiment, the display panel 120 includes the first substrate and the second substrate. The first substrate is provided with the driver circuit portion 121, the pixel portion 122, and the switching element 127.

Figure 15:
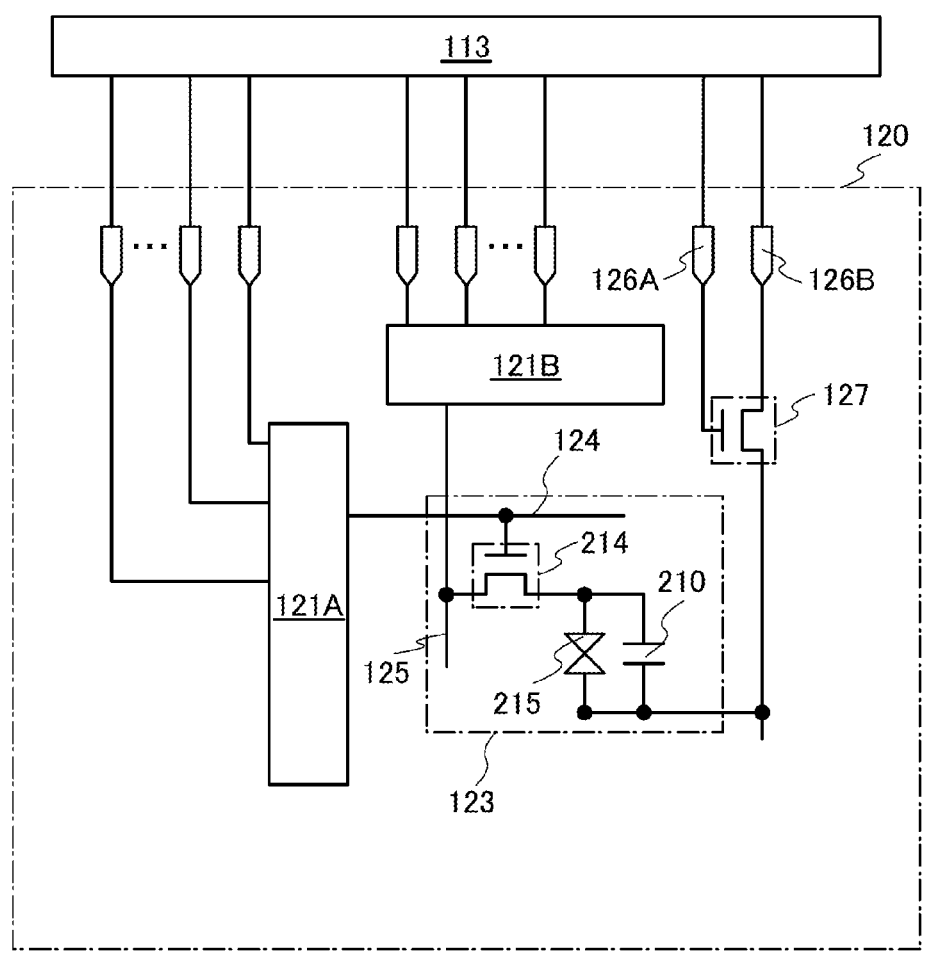
FIG. 15 is a diagram illustrating a structure of a driver circuit and a pixel of a semiconductor device.

The pixel 123 includes the transistor 214 as a switching element, and the capacitor 210 and the liquid crystal element 215 which are connected to the transistor 214 (see FIG. 15).

A transistor whose off-state current is reduced is preferably used for the transistor 214. When the transistor 214 is off, charges stored in the capacitor 210 and the liquid crystal element 215 which are connected to the transistor 214 whose off-state current is reduced are less likely to leak through the transistor 214, and a state where data is written before the transistor 214 is turned off can be held for a long time.

In this embodiment, liquid crystal is controlled by a vertical electric field that is generated by the pixel electrode provided over the first substrate and the common electrode provided over the second substrate which faces the first substrate.

As an example of liquid crystal applied to a liquid crystal element, the following can be given: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Alternatively, liquid crystal exhibiting a blue phase for which an alignment layer is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal showing a blue phase and a chiral agent is preferable because it has a small response time of 10 μsec to 100 μsec, has optical isotropy, which makes the alignment process unneeded, and has a small viewing angle dependence.

In addition, as a driving method of liquid crystal, the following can be used: a TN (twisted nematic) mode, an STN (super twisted nematic) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and the like.

The switching element 127 supplies a common potential Vcom to the common electrode 128 in accordance with a control signal output from the display control circuit 113. As the switching element 127, a transistor can be used. A gate electrode of the transistor and one of a source electrode and a drain electrode of the transistor may be connected to the display control circuit 113 so that the common potential Vcom is supplied from the display control circuit 113 to the one of the source electrode and the drain electrode of the transistor through the terminal portion 126. The other of the source electrode and the drain electrode of the transistor may be connected to the common electrode 128. Note that the switching element 127 may be formed over the same substrate as the driver circuit portion 121 or the pixel portion 122. Alternatively, the switching element 127 may be formed over another substrate.

A transistor whose off-state current is reduced is used as the switching element 127, whereby a reduction over time in the voltage applied to both terminals of the liquid crystal element 215 can be suppressed.

One of the source electrode and the drain electrode of the switching element 127 is electrically connected to the common electrode 128 through the common connection portion. Note that the common electrode 128 serves as one electrode of the capacitor 210 and one electrode of the liquid crystal element 215.

The other of the source electrode and the drain electrode of the switching element 127 is connected to a terminal 126B. A gate electrode of the switching element 127 is connected to a terminal 126A.

Figure 16:
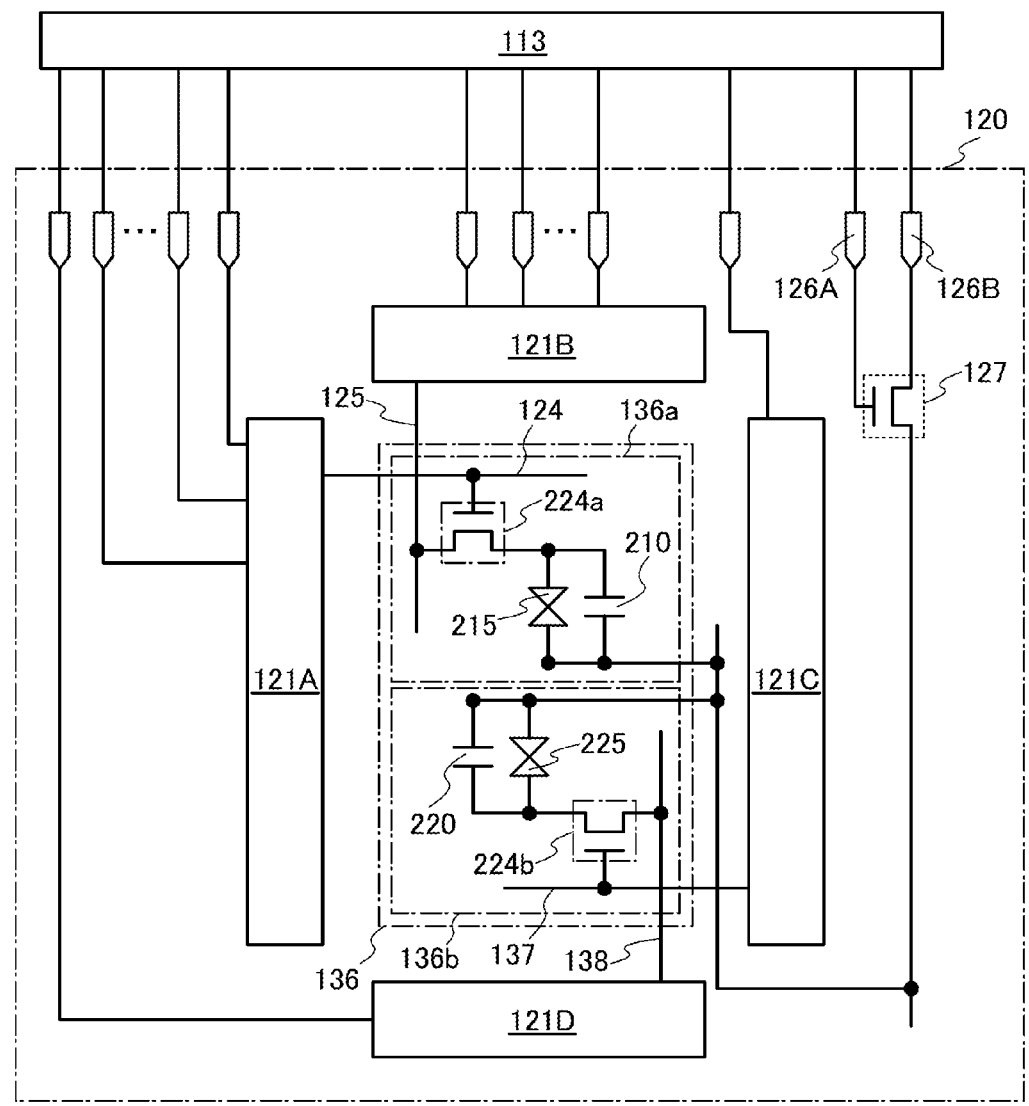
FIG. 16 is a diagram illustrating a structure of a driver circuit and a pixel of a semiconductor device.

A pixel structure in an equivalent circuit diagram of a liquid crystal display device illustrated in FIG. 16 is different from the pixel structure illustrated in FIG. 15. Note that description of the same structure as the equivalent circuit diagram of the liquid crystal display device in FIG. 15 is omitted to avoid repeated description.

A pixel 136 includes a first pixel 136a and a second pixel 136b.

The first pixel 136a includes a first transistor 224a, a capacitor 210 connected to the first transistor 224a, and a liquid crystal element 215. The liquid crystal element 215 is provided between a pixel electrode connected to the first transistor 224a and a counter electrode facing the pixel electrode. The pixel electrode connected to the first transistor 224a reflects incident light through a liquid crystal layer. The first transistor 224a is connected to a gate line side driver circuit 121A through a gate line 124 and connected to a source line side driver circuit 121B through a source line 125.

The second pixel 136b includes a second transistor 224b and a capacitor element 220 and a liquid crystal element 225 connected to the second transistor 224b. The liquid crystal element 225 is provided between a pixel electrode connected to the second transistor 224b and a counter electrode facing the pixel electrode. The pixel electrode connected to the second transistor 224b has a light-transmitting property. The second transistor 224b is connected to a gate line side driver circuit 121C through a gate line 137 and connected to a source line side driver circuit 121D through a source line 138.

The gate line side driver circuit 121A, the source line side driver circuit 121B, the gate line side driver circuit 121C, and the source line side driver circuit 121D are connected to the display control circuit 113. The display control circuit 113 determines a signal line to which the display control circuit 113 outputs an image signal.

Specifically, when the comparison circuit 112 determines that an image signal is a still image, the display control circuit 113 outputs the image signal to the first pixel 136a. When the comparison circuit 112 determines that the image signal is a moving image, the display control circuit 113 outputs the image signal to the second pixel 136b.

The display device described in this embodiment may include a photometric circuit. The display device provided with the photometric circuit can detect the brightness of the environment where the display device is put. Therefore, the display control circuit 113 connected to the photometric circuit can change a driving method of the display panel 120 in accordance with a signal input from the photometric circuit.

For example, when the photometric circuit detects the display device described in this embodiment that is used in a dim environment, the display control circuit 113 outputs an image signal to the second pixel 136b and the backlight 132 is turned on even when the comparison circuit 112 determines that the image signal is a still image. Since the second pixel 136b includes the light-transmitting pixel electrode, a still image with high visibility can be provided using the backlight.

For example, when the photometric circuit detects the display device described in this embodiment which is used under extremely bright external light (e.g., under direct sunlight outdoors), the display control circuit 113 outputs an image signal to the first pixel 136a even when the comparison circuit 112 determines that the image signal is a moving image. Since the first pixel 136a includes a pixel electrode which reflects incident light through the liquid crystal layer, a still image with high visibility can be provided even under extremely bright external light.

In other words, when the comparison circuit 112 determines that an image signals is a still image, the display control circuit 113 can output the image signal to the second pixel 136b, and when the comparison circuit 112 determines that the image signal is a moving image, the display control circuit 113 can output the image signal to the first pixel 136a.

According to the structure of this embodiment, there is a choice whether the backlight is used or not depending on the usage environment, which is convenient. In addition, power consumption is extremely low when a still image is displayed without use of the backlight.

Next, the state of signals supplied to the pixels will be described with reference to an equivalent circuit diagram of the liquid crystal display device illustrated in FIG. 15 and a timing chart illustrated in FIG. 17.

Figure 17:
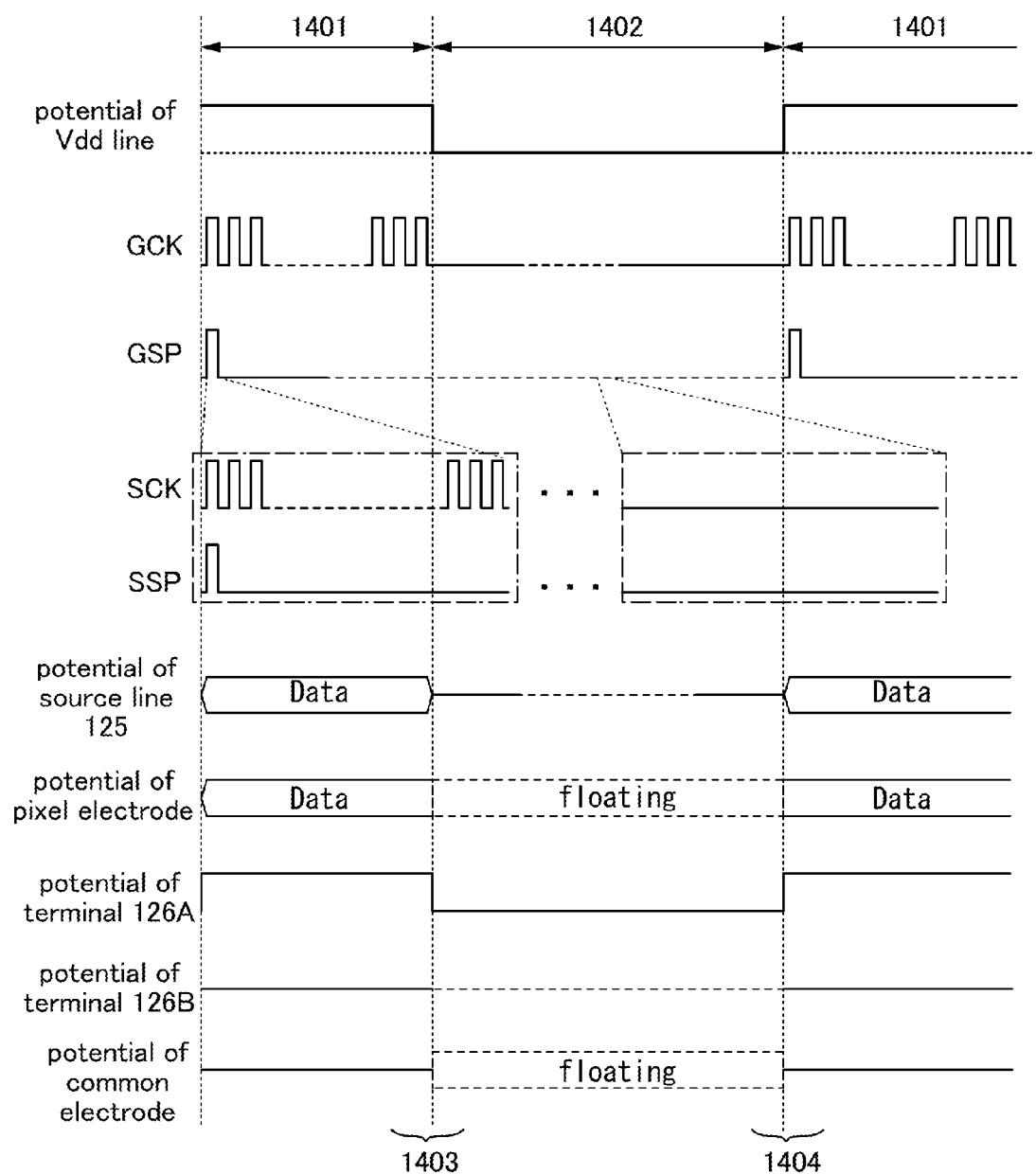
FIG. 17 is a timing chart illustrating operation of a semiconductor device.

In FIG. 17, a clock signal GCK and a start pulse GSP supplied from the display control circuit 113 to the gate line side driver circuit 121A are illustrated. In addition, in FIG. 17, a clock signal SCK and a start pulse SSP which are supplied from the display control circuit 113 to the source line side driver circuit 121B are illustrated. Note that, for the description of the timing at which the clock signal is output, the wavelength of the clock signal is illustrated with a simple rectangular wave in FIG. 17.

In FIG. 17, potential of Vdd line, potential of the source line 125, potential of the pixel electrode, potential of the terminal 126A, potential of the terminal 126B, and potential of the common electrode are illustrated.

In FIG. 17, a period 1401 corresponds to a period during which image signals for displaying a moving image are written. In the period 1401, operation is performed so that the potential of Vdd line is set to be Vdd, the image signal is supplied to each pixel in the pixel portion 122, and the common potential is supplied to the common electrode.

A period 1402 corresponds to a period during which a still image is displayed. In the period 1402, the potential of Vdd line is set to be the same potential as the low power supply potential Vss, the supply of the image signals and the common potential to the pixels in the pixel portion 122 and the common electrode is stopped. Note that in the period 1402 in FIG. 17, each signal is supplied so that the driver circuit portion stops operating; however, it is preferable to write image signals periodically in accordance with the length of the period 1402 and the refresh rate so as to prevent deterioration of a still image.

First, a timing chart in the period 1401 will be described. In the period 1401, the potential of Vdd line is set to be Vdd, a clock signal is supplied all the time as the clock signal GCK, and a pulse in accordance with a vertical synchronizing frequency is supplied as the start pulse GSP. In the period 1401, a clock signal is supplied all the time as the clock signal SCK, and a pulse in accordance with one gate selection period is supplied as the start pulse SSP.

In addition, the image signal Data is supplied to the pixels in each row through the source line 125, and the potential of the source line 125 is supplied to the pixel electrode in accordance with the potential of the gate line 124.

A potential at which the switching element 127 is turned on is supplied from the display control circuit 113 to the terminal 126A of the switching element 127, and the common potential is supplied to the common electrode through the terminal 126B.

On the other hand, the period 1402 is a period during which a still image is displayed. Next, a timing chart of the period 1402 is described. In the period 1402, the potential of Vdd line is set to be the same potential as the low power supply potential Vss, supplies of the clock signal GCK, the start pulse GSP, the clock signal SCK, and the start pulse SSP are all stopped. Further, in the period 1402, the supply of the image signal Data to the source line 125 is stopped. In the period 1402 where the supply of both the clock signal GCK and the start pulse GSP is being stopped, the transistor 214 is off and the potential of the pixel electrode is in a floating state.

A potential at which the switching element 127 is turned off is supplied from the display control circuit 113 to the terminal 126A of the switching element 127, and the potential of the common electrode is put in a floating state.

In the period 1402, the potentials of both electrodes of the liquid crystal element 215, i.e., the pixel electrode and the common electrode, are put in a floating state; thus, a still image can be displayed without an additional supply of potential.

The supplies of the clock signal and the start pulse to the gate line side driver circuit 121A and the source line side driver circuit 121B are stopped, whereby low power consumption can be achieved.

In particular, a transistor whose off-state current is reduced is used for each of the transistor 214 and the switching element 127, whereby a reduction over time in the voltage applied to both terminals of the liquid crystal element 215 can be suppressed.

Figure 18A:
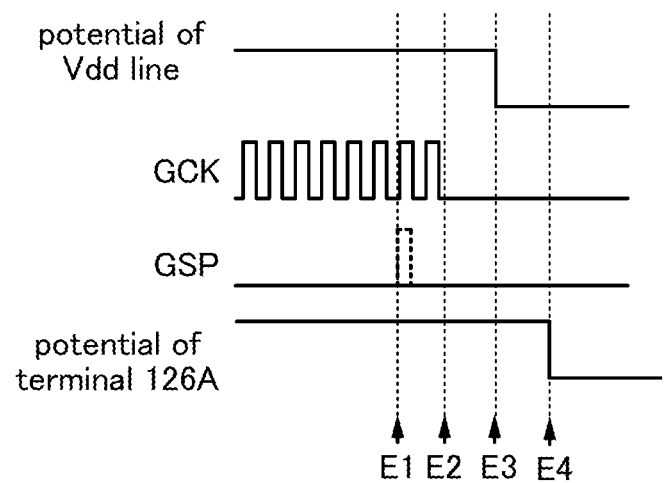
FIGS. 18A and 18B are timing charts each illustrating operation of a display control circuit of a semiconductor device.
Figure 18B:
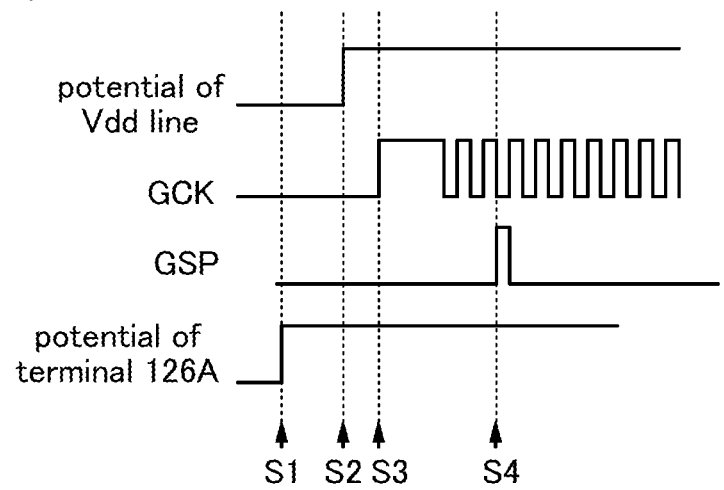

Next, operations of the display control circuit 113 in a period during which a displayed image is switched from a moving image to a still image (a period 1403 in FIG. 17) and in a period during which a displayed image is switched from a still image to a moving image (a period 1404 in FIG. 17) will be described with reference to FIGS. 18A and 18B. FIGS. 18A and 18B illustrate the potential of Vdd line, the clock signal (here, GCK), and the start pulse signal (here, GSP) which are output from the display control circuit 113, and potential of the terminal 126A.

The operation of the display control circuit in the period 1403 during which a displayed image is switched from a moving image to a still image is illustrated in FIG. 18A. The display control circuit stops the supply of the start pulse GSP (E1 in FIG. 18A, a first step). The supply of the start pulse GSP is stopped and then, the supply of a plurality of clock signals GCK is stopped after pulse output reaches the last stage of the shift register (E2 in FIG. 18A, a second step). Then, the potential of Vdd line is set to be the same potential as the low power supply potential Vss, (E3 in FIG. 18A, a third step). By setting the Vdd line and Vss line the same potential, potential difference is not generated in the driver circuit portion 121 which suppress increase of power consumption due to leakage of current or the like. After that, the potential of the terminal 126A is changed to a potential at which the switching element 127 is turned off (E4 in FIG. 18A, a fourth step).

Through the above steps, the supply of signals to the driver circuit portion 121 can be stopped without malfunction of the driver circuit portion 121. The malfunction occurred when a displayed image is switched from a moving image to a still image causes noise, and the noise is held as a still image; therefore, a liquid crystal display device that includes a display control circuit with fewer malfunctions can display a still image with less image deterioration.

Next, operation of the display control circuit in the period 1404 during which a displayed image is switched from a still image to a moving image will be illustrated in FIG. 18B. The display control circuit changes the potential of the terminal 126A into a potential at which the switching element 127 is turned on (S1 in FIG. 18B, a first step). Then, the potential of Vdd line is changed from the same potential as the low power supply potential Vss to the high power supply potential Vdd (S2 in FIG. 18B, a second step). After that, high potential is supplied as the clock signal GCK which is a pulsed signal longer than a regular clock signal GCK which is supplied later and then, a plurality of clock signals GCK are supplied (S3 in FIG. 18B, a third step). Next, the start pulse signal GSP is supplied (S4 in FIG. 18B, a fourth step).

Through the above steps, the supply of driving signals to the driver circuit portion 121 can be resumed without causing malfunction of the driver circuit portion 121. Potentials of the wirings are sequentially changed back to those at the time of displaying a moving image, whereby the driver circuit portion can be driven without malfunction.

Figure 19:
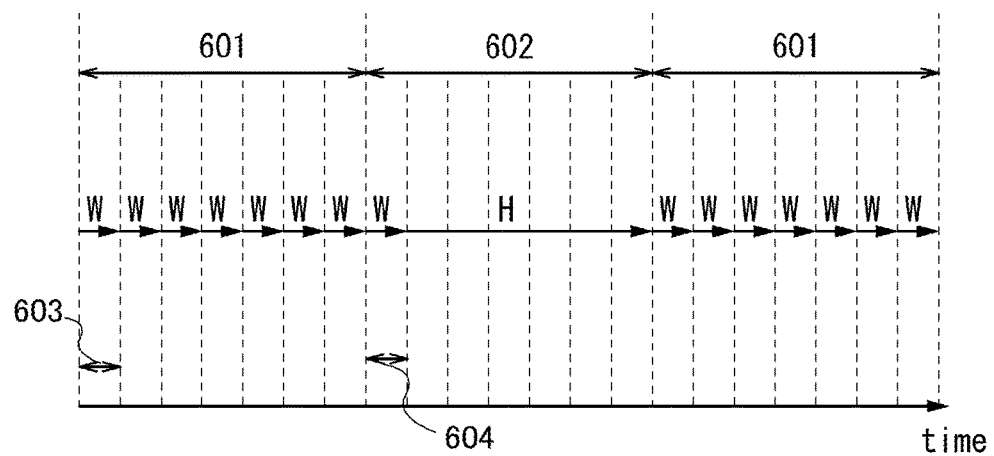
FIG. 19 is a schematic diagram illustrating the frequency of writing of image signals per frame period in a period for displaying a moving image and a period for displaying a still image of a semiconductor device.

FIG. 19 schematically illustrates writing frequency of image signals in frame periods in a period 601 during which a moving image is displayed and in a period 602 during which a still image is displayed. In FIG. 19, W indicates a period in which an image signal is written, and H indicates a period in which the image signal is held. In addition, a period 603 is one frame period in FIG. 19; however, the period 603 may be a different period.

As described above, in the structure of the liquid crystal display device of this embodiment, an image signal of a still image displayed in the period 602 is written in the period 604, and the image signal written in the period 604 is maintained in the other periods of the period 602.

Here, operation of displaying a moving image and a still image of a liquid crystal display device having the pixel structure illustrated in FIG. 15 is described with reference to FIG. 17, FIGS. 18A and 18B, and FIG. 19. The same can be said to a liquid crystal display device having the pixel structure illustrated in FIG. 16. The pixel 136 in FIG. 16 includes the pixel 136a having a reflective pixel electrode and the pixel 136b having a light-transmitting pixel electrode. One or both of the pixel 136a and the pixel 136b can be used for displaying a still image or a moving image. In other words, when the term "the pixel 123" is replaced with the term "the pixel 136", "the pixel 136a", or "the pixel 136b", operation of displaying a still image and a moving image of a liquid crystal display device can be described in the same way as that of the liquid crystal display device in FIG. 15.

The liquid crystal display device described in this embodiment as an example can decrease writing frequency of an image signal in a period during which a still image is displayed. As a result, power consumption at the time of displaying a still image can be reduced.

When a still image is displayed by rewriting the same image plural times, eye strain may be caused when switching of images is recognized. In the liquid crystal display device of this embodiment, writing frequency of an image signal is reduced, which is effective in reducing eye strain.

Specifically, in the liquid crystal display device of this embodiment, transistors whose off-state currents are reduced are used for pixels and a switching element of the common electrode, whereby a period (time) of holding voltage in a storage capacitor can be longer. As a result, writing frequency of an image signal can be extremely reduced, which is significantly effective in reducing power consumption and eyestrain when a still image is displayed.

This embodiment can be combined with any of the other embodiments in this specification as appropriate.

Embodiment 5

In this embodiment, an example of an electronic device including the liquid crystal display device described in any of Embodiments 1 to 4 will be described.

Figure 20A:
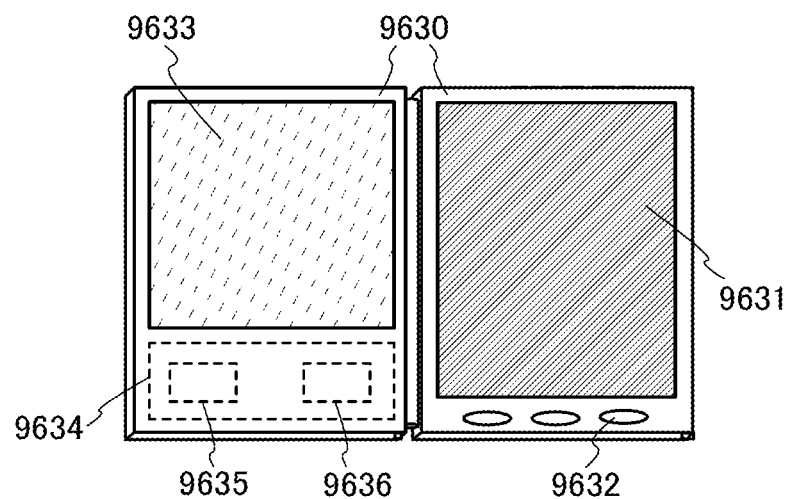
FIGS. 20A and 20B are diagrams illustrating an example of an electronic device including a semiconductor device.

FIG. 20A illustrates an electronic book reader (also referred to as an e-book reader) which can include housings 9630, a display portion 9631, operation keys 9632, a solar battery 9633, and a charge and discharge control circuit 9634. The electronic book reader is provided with the solar battery 9633 and a display panel so that the solar battery 9633 and the display panel can be opened and closed freely. In the electronic book reader, power from the solar cell is supplied to the display panel or a video signal processing portion. The electronic book reader illustrated in FIG. 20A can have a function of displaying various kinds of data (e.g., a still image, a moving image, and a text image), a function of displaying a calendar, a date, the time, or the like on the display portion, a touch-input function of operating or editing the information displayed on the display portion by touch input, a function of controlling processing by various kinds of software (programs), and the like. Note that in FIG. 20A, a structure including a battery 9635 and a DCDC converter (hereinafter abbreviated as a converter 9636) is illustrated as an example of the charge and discharge control circuit 9634.

The display portion 9631 is a reflective liquid crystal display device having a touch-input function with the use of photo sensors and is used in a comparatively bright environment. Therefore, the structure illustrated in FIG. 20A is preferable because power generation by the solar battery 9633 and charge in the battery 9635 can be performed effectively. Note that a structure in which the solar battery 9633 is provided on each of a surface and a rear surface of the housing 9630 is preferable in order to charge the battery 9635 efficiently. When a lithium ion battery is used as the battery 9635, there is an advantage of downsizing or the like.

The semi-transmissive liquid crystal display device described in Embodiment 1 is used in the display portion 9631, so that an electronic book reader with bright and high-quality display can be realized.

Figure 20B:
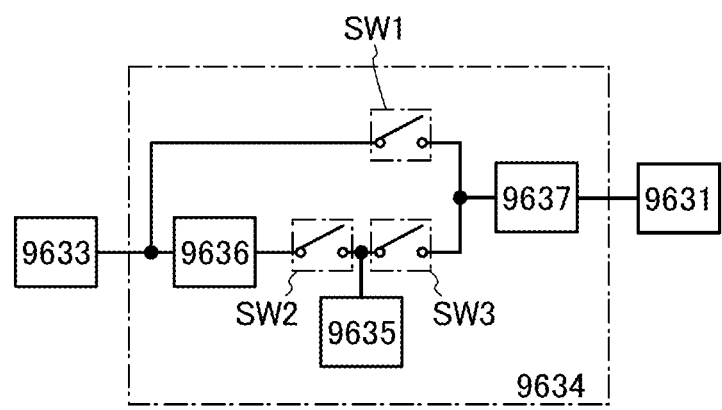

The structure and the operation of the charge and discharge control circuit 9634 illustrated in FIG. 20A are described with reference to a block diagram in FIG. 20B. FIG. 20B illustrates the solar battery 9633, the battery 9635, the converter 9636, a converter 9637, switches SW1 to SW3, and the display portion 9631. The battery 9635, the converter 9636, a converter 9637, and switches SW1 to SW3 correspond to the charge and discharge control circuit 9634.

First, an example of operation when power is generated by the solar battery 9633 using external light is described. The voltage of power generated by the solar battery is raised or lowered so that the power has a voltage for charging the battery 9635. Then, when the power from the solar battery 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that although the solar battery 9633 is described as an example of a means for charge, charge of the battery 9635 may be performed with another means. Alternatively, a combination of the solar battery 9633 and another means for charge may be used.

This embodiment can be implemented in appropriate combination with the structures described in the other embodiments.

This application is based on Japanese Patent Application serial No. 2010-043185 filed with Japan Patent Office on Feb. 26, 2010, the entire contents of which are hereby incorporated by reference.

What is claimed is:

1. An active matrix display device comprising:
a backlight configured to emit light; and
a pixel portion over the backlight, the pixel portion comprising:
a first layer;
a second layer over and in contact with the first layer;
a reflective layer over and in contact with the second layer;
a reflective electrode comprising an opening; and
a liquid crystal element over the reflective electrode,
wherein the opening is located over the first layer, the second layer, and the reflective layer,
wherein a refractive index of the first layer is different from a refractive index of the second layer,
wherein the second layer includes a first side and a second side opposite the first side,
wherein the reflective layer includes a first surface in contact with the first side of the second layer,
wherein the reflective layer includes a second surface in contact with the second side of the second layer,
wherein the first layer is provided between the first surface and the second surface of the reflective layer, and
wherein the opening is configured to transmit light.

2. The active matrix display device according to claim 1, wherein a shape of the opening is square.

3. The active matrix display device according to claim 1, wherein the opening is surrounded by parts of the reflective electrode.

4. The active matrix display device according to claim 1, wherein the reflective electrode comprises a curving surface with an uneven shape.

5. The active matrix display device according to claim 1, wherein the reflective electrode comprises a plurality of conductive films.

6. The active matrix display device according to claim 1, wherein the reflective electrode is configured to reflect light transmitted through the liquid crystal element.

7. The active matrix display device according to claim 1, wherein the reflective electrode comprises at least one of silver and aluminum.

8. The active matrix display device according to claim 1, further comprising a transparent electrode overlapping with the opening.

9. The active matrix display device according to claim 1, further comprising an insulating layer comprising an organic resin,
wherein the reflective electrode is provided over the insulating layer.

10. An active matrix display device comprising:
a pixel portion comprising:
a first layer;
a second layer over and in contact with the first layer;
a reflective layer over and in contact with the second layer;
a reflective electrode comprising a plurality of openings; and
a liquid crystal element over the reflective electrode,
wherein the plurality of openings is located over the first layer, the second layer, and the reflective layer,
wherein a refractive index of the first layer is different from a refractive index of the second layer,
wherein the second layer includes a first side and a second side opposite the first side,
wherein the reflective layer includes a first surface in contact with the first side of the second layer,
wherein the reflective layer includes a second surface in contact with the second side of the second layer,
wherein the first layer is provided between the first surface and the second surface of the reflective layer, and
wherein the plurality of openings is configured to transmit light.

11. The active matrix display device according to claim 10, wherein a shape of each of the plurality of openings is square.

12. The active matrix display device according to claim 10, wherein each of the plurality of openings is surrounded by parts of the reflective electrode.

13. The active matrix display device according to claim 10, wherein the reflective electrode comprises a curving surface with an uneven shape.

14. The active matrix display device according to claim 10, wherein the reflective electrode comprises a plurality of conductive films.

15. The active matrix display device according to claim 10, wherein the reflective electrode is configured to reflect light transmitted through the liquid crystal element.

16. The active matrix display device according to claim 10, wherein the reflective electrode comprises at least one of silver and aluminum.

17. The active matrix display device according to claim 10, further comprising a transparent electrode overlapping with the plurality of openings.

18. The active matrix display device according to claim 10, further comprising an insulating layer comprising an organic resin,
wherein the reflective electrode is provided over the insulating layer.

19. An active matrix display device comprising:
a thin film transistor over an insulating surface;
a first layer over the insulating surface;
a second layer over and in contact with the first layer;
a reflective layer over and in contact with the second layer;
a reflective electrode electrically connected to the thin film transistor, the reflective electrode comprising an opening; and
a liquid crystal element over the reflective electrode,
wherein the opening is located over the first layer, the second layer, and the reflective layer,
wherein a refractive index of the first layer is different from a refractive index of the second layer,
wherein the second layer includes a first side and a second side opposite the first side,
wherein the reflective layer includes a first surface in contact with the first side of the second layer,
wherein the reflective layer includes a second surface in contact with the second side of the second layer,
wherein the first layer is provided between the first surface and the second surface of the reflective layer, and
wherein the opening is configured to transmit light.

20. The active matrix display device according to claim 19, wherein the opening is surrounded by parts of the reflective electrode.

21. The active matrix display device according to claim 19, wherein the reflective electrode is configured to reflect light transmitted through the liquid crystal element.

22. The active matrix display device according to claim 19, further comprising a transparent electrode overlapping with the opening.

23. The active matrix display device according to claim 19, further comprising an insulating layer comprising an organic resin,
wherein the reflective electrode is provided over the insulating layer.

* * * * *